(12) United States Patent
Huangfu et al.

(10) Patent No.: US 11,417,713 B2
(45) Date of Patent: Aug. 16, 2022

(54) SUBSTRATE AND MANUFACTURING METHOD THEREFOR, AND ELECTRONIC APPARATUS

(71) Applicant: BOE TECHNOLOGY GROUP CO., LTD., Beijing (CN)

(72) Inventors: Lujiang Huangfu, Beijing (CN); Libin Liu, Beijing (CN); Yipeng Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 5 days.

(21) Appl. No.: 17/170,437

(22) Filed: Feb. 8, 2021

(65) Prior Publication Data

US 2021/0167142 A1 Jun. 3, 2021

Related U.S. Application Data

(63) Continuation of application No. 16/481,482, filed as application No. PCT/CN2018/121508 on Dec. 17, 2018, now Pat. No. 10,943,957.

(30) Foreign Application Priority Data

Dec. 19, 2017 (CN) .................. 201711376371.X

(51) Int. Cl.
*H01L 27/32* (2006.01)
*H01L 27/11* (2006.01)
*H01L 27/01* (2006.01)

(52) U.S. Cl.
CPC ...... *H01L 27/3223* (2013.01); *H01L 27/1116* (2013.01); *H01L 27/3244* (2013.01); *H01L 27/016* (2013.01)

(58) Field of Classification Search
CPC ............ H01L 27/3223; H01L 27/1116; H01L 27/3276; H01L 27/124
See application file for complete search history.

(56) References Cited

U.S. PATENT DOCUMENTS 7,759,858 B2   7/2010   Jung et al.
9,923,043 B2   3/2018   Shin
(Continued)

FOREIGN PATENT DOCUMENTS

CN   101494201 A   7/2009
CN   104485349 A   4/2015
(Continued)

OTHER PUBLICATIONS

International Search Report dated Mar. 15, 2019 for International Application No. PCT/CN2018/121508, 18 pages.
(Continued)

*Primary Examiner* — Changhyun Yi
(74) *Attorney, Agent, or Firm* — Dave Law Group LLC; Raj S. Dave

(57) ABSTRACT

A substrate and a manufacturing method therefor, and an electronic device are provided. The substrate includes: a base substrate including a working region, and a non-working region outside of the working region, the non-working region including a peripheral circuit region near the working region and a non-circuit region away from the working region; a peripheral circuit in the peripheral circuit region; a common electrode lead in the non-working region; a common electrode; and a bridging conductive layer made of opaque conductive material in the non-working region and electrically connects the common electrode and the common electrode lead. An orthographic projection of the bridging conductive layer on the base substrate at least partially coincides with an orthographic projection of the
(Continued)

peripheral circuit region on the base substrate, and bridging conductive layer is insulated from the peripheral circuit.

20 Claims, 14 Drawing Sheets

(56) References Cited

U.S. PATENT DOCUMENTS

| | | | |
|---|---|---|---|
| 2012/0146493 | A1 | 6/2012 | Ra |
| 2015/0034955 | A1 | 2/2015 | Hayashi et al. |
| 2015/0108438 | A1* | 4/2015 | Kim .................... H01L 27/3258 257/40 |
| 2016/0349565 | A1 | 12/2016 | Kim et al. |
| 2017/0077192 | A1* | 3/2017 | Jang .................... H01L 27/3244 |

FOREIGN PATENT DOCUMENTS

| | | |
|---|---|---|
| CN | 104777637 A | 7/2015 |
| CN | 105242467 A | 1/2016 |
| CN | 105244365 A | 1/2016 |
| CN | 207517696 U | 6/2018 |

OTHER PUBLICATIONS

Office action issued for EP application No. 18893149.7 dated Aug. 16, 2021, 8 pages.

\* cited by examiner

SUBSTRATE AND MANUFACTURING METHOD THEREFOR, AND ELECTRONIC APPARATUS

CROSS REFERENCE TO RELATED APPLICATIONS

The present application is a Continuation application of U.S. application Ser. No. 16/481,482, filed on Jul. 28, 2019 which claims the benefits of and priority to the Chinese patent application No. 201711376371.X, filed on Dec. 19, 2017, entitled "A SUBSTRATE AND A METHOD OF MANUFACTURING THE SAME, AN ELECTRONIC DEVICE," and it is incorporated herein by reference in its entirety.

TECHNICAL FIELD

At least one embodiment of the present disclosure relates to a substrate and a method of manufacturing the same, an electronic device.

BACKGROUND

Driving circuits, integrated circuit chips and so on for control of display operation are generally provided in or connected to a peripheral circuit region that surrounds a display region of a display. These structures occupy a larger space, and this will lead to a larger bezel size of the display. To increase the percentage of the area of the display area to the area of the display as much as possible while the reliability of fixing between the bezel and the display screen is ensured, it is necessary that the size of the peripheral circuit region is compressed as much as possible to form a bezel that is as narrow as possible. As the resolution of the display is becoming bigger and bigger, to decrease the percentage of a bezel in the display as much as possible, the manufacturers are all devoted to a research in narrowing of the display's bezel.

SUMMARY

At least one embodiment of the present disclosure provides a substrate, comprising a base substrate, a peripheral circuit, and a common electrode lead. The base substrate comprises a working region, a non-working region outside of the working region and an outer profile edge. The non-working region includes a peripheral circuit region near the working region and a non-circuit region away from the working region. The peripheral circuit is in the peripheral circuit region. The common electrode lead is in the non-working region. The peripheral circuit region is provided with the peripheral circuit, and the peripheral circuit is not provided in the non-circuit region. An orthographic projection of the common electrode lead on the base substrate at least partially coincides with an orthographic projection of the peripheral circuit region on the base substrate, and the common electrode lead is insulated from the peripheral circuit.

For example, in the substrate provided by an embodiment of the present disclosure, the orthographic projection of the common electrode lead on the base substrate at least partially coincides with the orthographic projection of the peripheral circuit on the base substrate.

For example, in the substrate provided by an embodiment of the present disclosure, the common electrode lead extends along at least part of the outer profile edge, and a portion of the common electrode lead is in the non-circuit region.

For example, in the substrate provided by an embodiment of the present disclosure, the orthographic projection of the common electrode lead on the base substrate is within the orthographic projection of the peripheral circuit on the base substrate.

For example, the substrate provided by an embodiment of the present disclosure further comprises a common electrode, the common electrode extending from the working region to the non-working region; and the common electrode being electrically connected to the common electrode lead.

For example, the substrate provided by an embodiment of the present disclosure further comprises a bridging conductive layer, the bridging conductive layer being in the non-working region, insulated from the peripheral circuit and electrically connecting the common electrode lead with the common electrode.

For example, in the substrate provided by an embodiment of the present disclosure, the bridging conductive layer directly overlaps with the common electrode lead to realize electrical connection between the bridging conductive layer and the common electrode lead; and the common electrode and the bridging conductive layer are of an integral structure.

For example, in the substrate provided by an embodiment of the present disclosure, the bridging conductive layer directly overlaps with the common electrode lead to realize electrical connection between the bridging conductive layer and the common electrode lead; and the common electrode directly overlaps with the bridging conductive layer to realize electrical connection between the common electrode and the bridging conductive layer.

For example, in the substrate provided by an embodiment of the present disclosure, the peripheral circuit includes an external connection portion including an external connection joint and an external connection lead; and an orthographic projection of the external connection joint on the base substrate does not coincides with the orthographic projection of the common electrode lead on the base substrate.

For example, in the substrate provided by an embodiment of the present disclosure, the external connection joint is on a side of the common electrode lead near the outer profile edge of the base substrate.

For example, in the substrate provided by an embodiment of the present disclosure, the external connection joint is on a side of the common electrode lead away from the outer profile edge of the base substrate.

For example, the substrate provided by an embodiment of the present disclosure further comprises an interlayer insulating layer, the interlayer insulating layer being provided between the peripheral circuit and the common electrode lead, and covering the peripheral circuit to insulate the peripheral circuit from the common electrode lead.

For example, in the substrate provided by an embodiment of the present disclosure, an end of the interlayer insulating layer near the outer profile edge of the base substrate has a flat surface, and the common electrode lead is arranged on the flat surface.

For example, in the substrate provided by an embodiment of the present disclosure, the interlayer insulating layer includes a via hole exposing an external connection joint of the peripheral circuit, and the external connection lead is electrically connected to the external connection joint of the peripheral circuit through the via hole.

For example, in the substrate provided by an embodiment of the present disclosure, the external connection lead and the common electrode lead are of a same material and provided in a same layer.

For example, in the substrate provided by an embodiment of the present disclosure, the peripheral circuit includes a first thin film transistor and a second thin film transistor, a capacitor, a peripheral circuit signal output lead, and a connecting line. Each of the first thin film transistor and the second thin film transistor includes a gate electrode, a source electrode and a drain electrode. The capacitor includes a first plate and a second plate disposed oppositely to each other, the first plate and gate electrodes of the thin film transistors being arranged in a same layer. The peripheral circuit signal output lead is configured to output an output signal of the peripheral circuit to the working region. The connecting line includes a first portion. The second plate of the capacitor is electrically connected with the source electrode of the drain electrode of the first thin film transistor through the first portion of the connecting line. The external connection joint, the second plate of the capacitor and the connecting line are provided in a same layer.

For example, in the substrate provided by an embodiment of the present disclosure, the connecting line further includes a second portion and a third portion. The drain electrode of the first thin film transistor is electrically connected with the source electrode of the second thin film transistor through a second portion of the connecting line; and the drain electrode of the second thin film transistor is electrically connected to the peripheral circuit signal output lead through a third portion of the connecting line.

For example, in the substrate provided by an embodiment of the present disclosure, the working region includes a display element, the display element includes a pixel defining layer, a light-emitting layer, a first electrode and a second electrode. The pixel defining layer includes a plurality of openings. The light-emitting layer is provided in the plurality of openings. The first electrode covers the pixel defining layer and the light-emitting layer, and extends from the display region toward the first common electrode lead. The second electrode is provided between the base substrate and the light-emitting layer. The first electrode is a common cathode, and the first common electrode lead is a common cathode wire; or the first electrode is a common anode, and the first common electrode lead is a common anode wire.

At least one embodiment also provides an electronic device, comprising any of the substrates.

At least one embodiment also provides a method of manufacturing a substrate, comprising: providing a base substrate, the base substrate including a working region, a non-working region outside of the working region and an outer profile edge, the non-working region including a peripheral circuit region near the working region and a non-circuit region away from the working region; forming a peripheral circuit in the peripheral circuit region of the non-working region; and forming a common electrode lead extending along at least part of the outer profile edge of the base substrate. The peripheral circuit region is provided with the peripheral circuit, the peripheral circuit is not provided in the non-circuit region, an orthographic projection of the common electrode lead on the base substrate at least partially coincides with an orthographic projection of the peripheral circuit region on the base substrate, and the common electrode lead is insulated from the peripheral circuit.

For example, the substrate manufacturing method provided by an embodiment of the present disclosure further comprises forming a bridging conductive layer. The bridging conductive layer is formed in the non-working region, and is insulated from the peripheral circuit and electrically connects the common electrode lead with the common electrode.

For example, the substrate manufacturing method provided by an embodiment of the present disclosure further comprises forming a common electrode in the working region, the common electrode being electrically connected to the common electrode lead.

For example, in the substrate manufacturing method provided by an embodiment of the present disclosure, the forming the peripheral circuit includes forming an external connection portion of the peripheral circuit, the external connection portion including an external connection joint and an external connection lead, and an orthographic projection of the external connection joint on the base substrate does not coincide with the orthographic projection of the common electrode lead on the base substrate.

For example, in the substrate manufacturing method provided by an embodiment of the present disclosure, the forming the peripheral circuit includes forming a first thin film transistor and a second thin film transistor, each of the first thin film transistor and the second thin film transistor includes a gate electrode, a source electrode and a drain electrode; forming a gate metal layer pattern, which includes forming a gate electrode of the first thin film transistor and a gate electrode of the second thin film transistor, a first plate of a capacitor, and a peripheral circuit output lead by a same patterning process with a same mask; and forming a second metal layer pattern, which includes forming a second plate of the capacitor, a connecting line of the peripheral circuit and the external connection joint by a same patterning process with a same mask. The connecting line includes a first portion, a second portion and a third portion; the second plate of the capacitor is electrically connected to the source electrode of the first thin film transistor by the first portion of the connecting line; the drain electrode of the first thin film transistor is electrically connected with the source electrode of the second thin film transistor by the second portion of the connecting line; and the drain electrode of the second thin film transistor is electrically connected to the peripheral circuit signal output lead by the third portion of the connecting line.

For example, the substrate manufacturing method provided by an embodiment of the present disclosure further comprises forming an interlayer insulating layer and a via hole in the interlayer insulating layer exposing the external connection joint. The interlayer insulating layer is provided between the peripheral circuit and the common electrode lead, covers the peripheral circuit to insulate the peripheral circuit from the common electrode lead. The external connection lead is electrically connected to the external connection point through the via hole, and the external connection lead and the common electrode lead are formed by a same patterning process with a same mask.

BRIEF DESCRIPTION OF THE DRAWINGS

A brief description will be given below to the accompanying drawings of the embodiments to provide a more clear understanding of the technical proposals of the embodiments of the present disclosure. Apparently, the drawings described below only involve some embodiments of the present disclosure but are not intended to limit the present disclosure.

DETAILED DESCRIPTION

Figure 1:
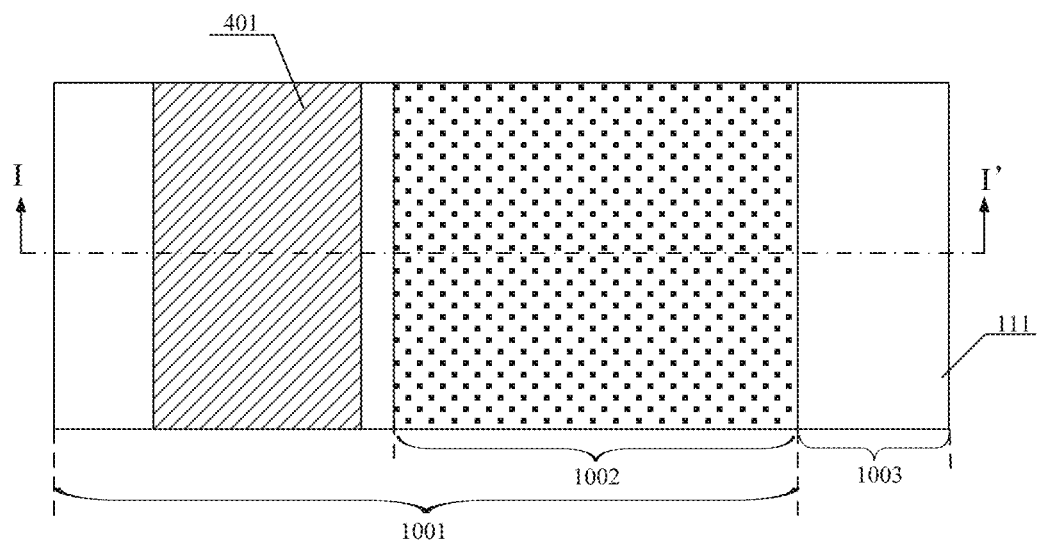
FIG. 1 is a schematic plan view of a substrate.

In order to make objects, technical details and advantages of the embodiments of the present disclosure apparent, the technical solutions of the embodiments will be described in a clearly and completely way in connection with the drawings related to the embodiments of the disclosure. Apparently, the described embodiments are just a part but not all of the embodiments of the disclosure. Based on the described embodiments herein, one of ordinary skill in the art can obtain other embodiment(s), without any inventive work, which shall be within the scope of the disclosure.

Unless otherwise defined, all the technical and scientific terms used herein have the same meanings as commonly understood by one of ordinary skill in the art to which the present disclosure belongs. The terms, such as 'first,' or the like, which are used in the description and the claims of the present disclosure, are not intended to indicate any sequence, amount or importance, but for distinguishing various components. The terms, such as 'comprise/comprising,' include/including; or the like are intended to specify that the elements or the objects stated before these terms encompass the elements or the objects and equivalents thereof listed after these terms, but not preclude other elements or objects. The terms, 'in/inside,' 'out/outside,' 'on,' 'under,' or the like are only used to indicate relative position relationship, and when the absolute position of the object which is described is changed, the relative position relationship may be changed accordingly.

The dimensions of attached drawings used in the present disclosure are not drawn strictly in accordance with the actual proportion, and the amount of components in an array substrate is not limited to the amount shown in the drawings. The specific dimension and quantity of each structure may be determined according to the actual needs. The attached drawings in this disclosure are only structurally schematic diagrams.

In this disclosure, "outside of a working region" refers to a side of the working region near the outer profile edge of a base substrate. The direct overlap between structure A and structure B refers to that structure A contacts structure B and no any other structure exists between the structure A and the structure B. For example, structure A is a bridging conductive layer, and structure B is a common electrode lead. For example, structure A is a common electrode, and structure B is a bridging conductive layer.

It is to be noted that for a source electrode and a drain electrode of any one of thin film transistors in the present disclosure, the two are merely distinguished by the name, and in fact, the source electrode and the drain electrode of any of a plurality of thin film transistors in the present disclosure are exchangeable.

For an organic light emitting diode (OLED) display device, it may not use a backlight, and moreover, the display viewing angle is wide, the picture quality is uniform, the response speed is fast, colorization is easier, light emission can be achieved with a simple driving circuit, the manufacturing process is simple, manufacture into a flexible panel is possible, it complies with the demands of lightness, thinness, shortness and smallness, and the application covers panels of various sizes. However, an active matrix OLED (AMOLED) display device at present stage still has some shortcomings in some aspects. For example, compared with an active matrix LCD (AMLCD) display device, a peripheral circuit structure of an active back panel for the AMOLED display device occupies a relatively large area, and this makes its frame width be larger. In addition, lifetime of the AMOLED display device is also lower than that of the AMLCD at present, and it is partly due to the fact that the Joule heat at a current concentration region in the peripheral circuit leads to a higher temperature rise, and the lifetime of OLED devices in the vicinity of this region is adversely affected. Reducing the temperature rise caused by the Joule heat of the peripheral circuit also needs to occupy a larger area to reduce the wiring resistance of the peripheral circuit generally.

Figure 2:
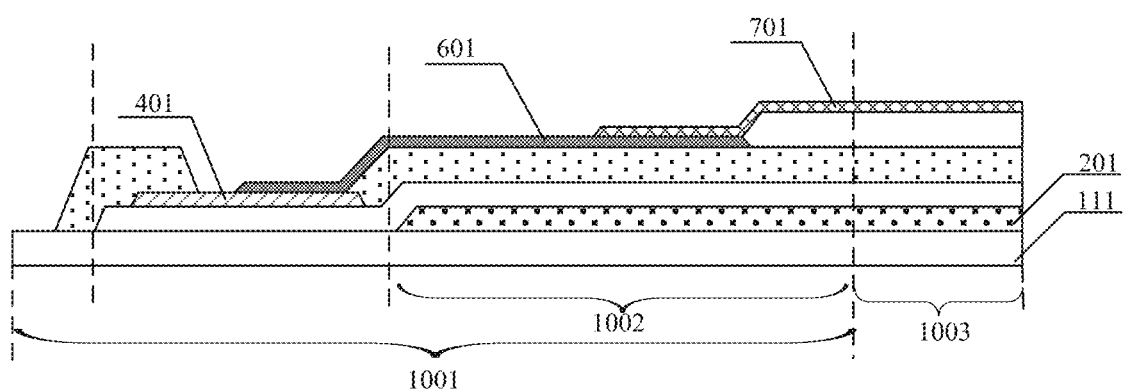
FIG. 2 is a schematically sectional view taken along a line I-I' in FIG. 1.

FIG. 1 is a schematic plan view of a substrate, and FIG. 2 is a schematically sectional view taken along a line I-I' in FIG. 1. Referring to FIG. 1 and FIG. 2, the substrate is a display substrate, which includes a base substrate 111 including a display region 1003 and a peripheral region 1001 around the display region 1003, and the peripheral region 1001 includes a drive circuit region 1002. On the base substrate 111, a drive circuit layer 201 is disposed, and in a place of the drive circuit layer 201 corresponding to the drive circuit region 1002, a driving circuit is disposed, such as a gate driving circuit. The substrate further includes a common electrode lead 401 disposed on the base substrate 111. The common electrode lead 401 is located on a side of the drive circuit region 1002 away from the display region 1003, and extends along the outer profile edge of the base substrate 111. A first insulating layer is arranged between the common electrode lead 401 and the drive circuit layer 201, so that the common electrode lead 401 is insulated from the driving circuit located in the drive circuit region 1002. The substrate's peripheral circuit structure further includes a bridging conductive layer 601 and a common electrode 701 that is electrically connected to the common electrode lead 401 via the bridging conductive layer 601, that is, the bridging conductive layer 601 acts as a bridge by which electrical connection between the common electrode 701 and the common electrode lead 401 is realized. The common electrode 701 extends from the display region 103 to the drive circuit region 1002 and contacts an end of the bridging conductive layer 601 near the display region 1003 so as to achieve electrical connection, and an end of the bridging conductive layer 601 away from the display region 1003 contacts the common electrode lead 401 so as to achieve electrical connection.

In the display substrate shown in FIG. 1 and FIG. 2, the common electrode lead occupies a given width alone (that is, it does not share with other circuit structure) around the display region, that is, it occupies a given area alone, and this is not advantage in achieving a narrower bezel around the display region. In addition, the distance between the common electrode lead and the common electrode is larger, and the width of the bridging conductive layer is longer, which results in a larger resistance of the bridging conductive layer, and it is not advantage to increase the transmission speed of signal, and will also lead to the increasing of joule heat, and it is also disadvantage to the lifetime of the display device to which the display substrate is applied.

According to at least one embodiment of the present disclosure, a substrate is provided, which includes a base substrate, a peripheral circuit and a common electrode lead. The base substrate includes a working region, a non-working region outside of the working region and an outer profile edge. The non-working region includes a peripheral circuit region near the working region and a non-circuit region away from the working region. The peripheral circuit is arranged in the peripheral circuit region, and the common electrode lead is arranged in the non-working region. The peripheral circuit region includes the peripheral circuit provided therein, and the peripheral circuit is not provided in the non-circuit region. The orthographic projection of the common electrode lead on the base substrate at least partially coincides with the orthographic projection of the peripheral circuit region on the base substrate, and the common electrode lead is insulated from the peripheral circuit.

Figure 3:
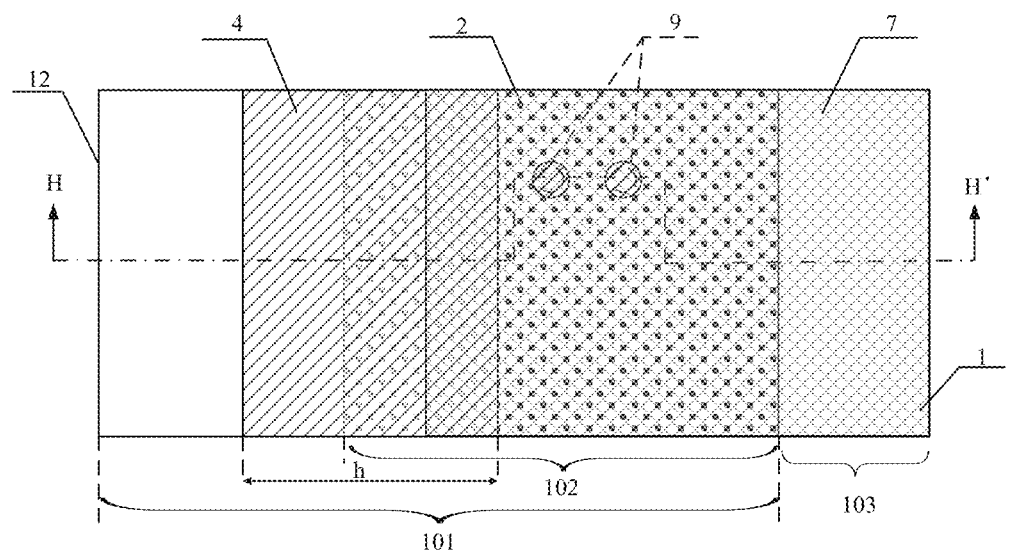
FIG. 3 is a schematic plan view of a substrate provided by an embodiment of the present disclosure.
Figure 4A:
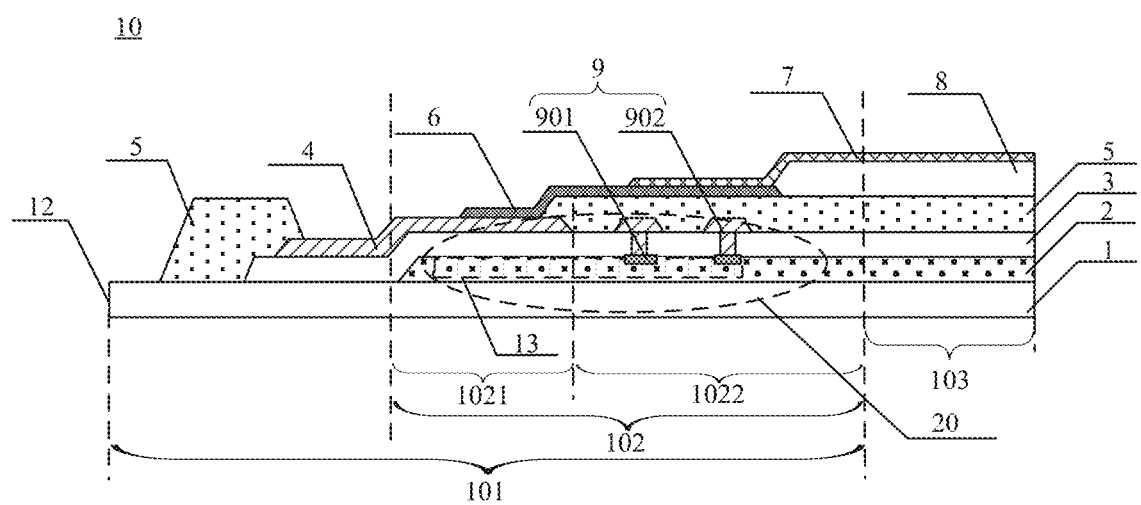
FIG. 4A is a schematically sectional view taken along a line H-H' in FIG. 3.
Figure 4B:
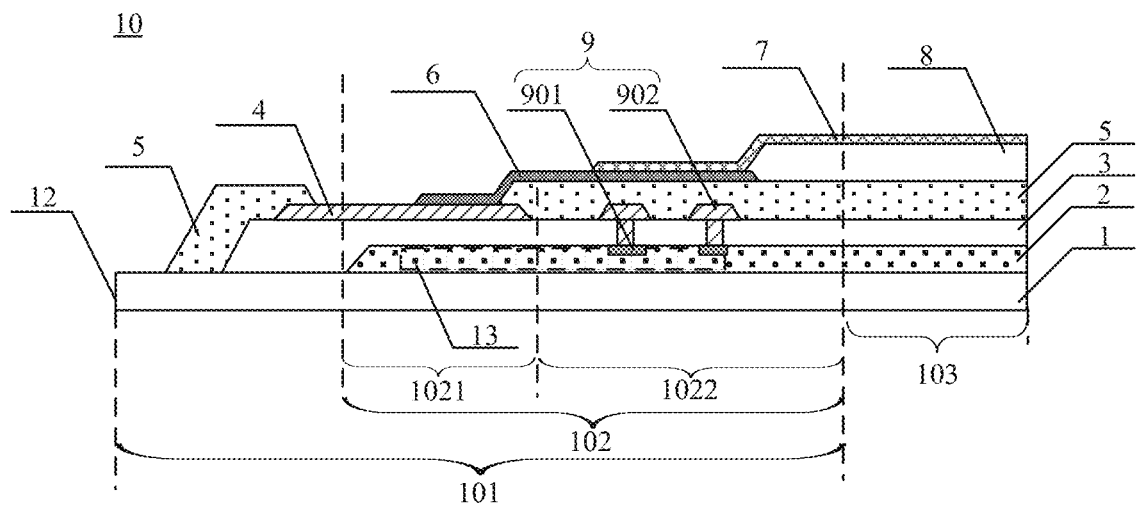
FIG. 4B is another schematically sectional view taken along the line H-H' in FIG. 3.
Figure 4C:
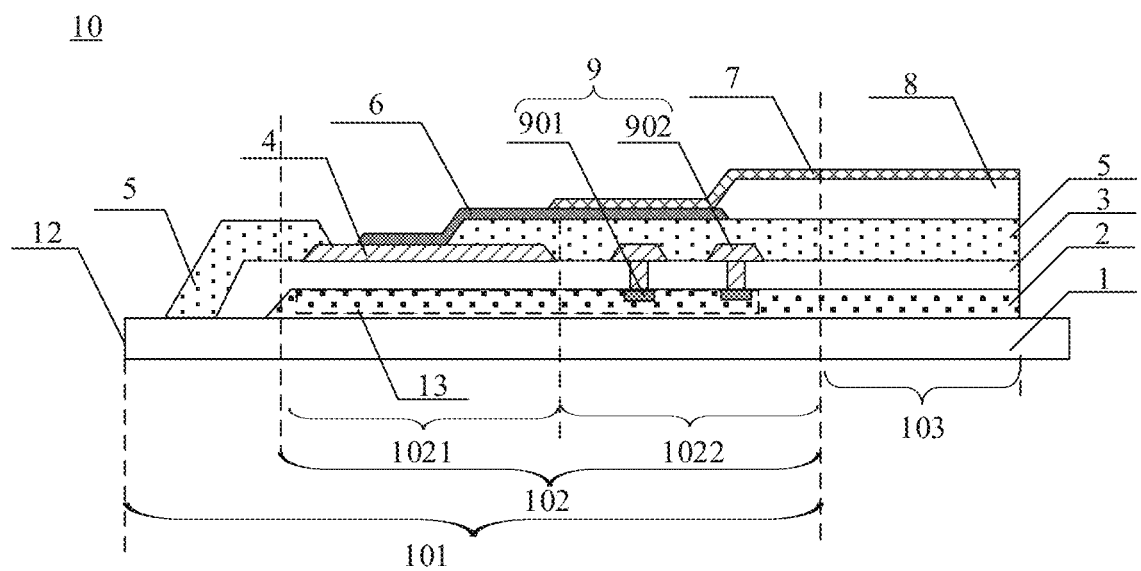
FIG. 4C is still another schematically sectional view taken along the line H-H' in FIG. 3.
Figure 4D:
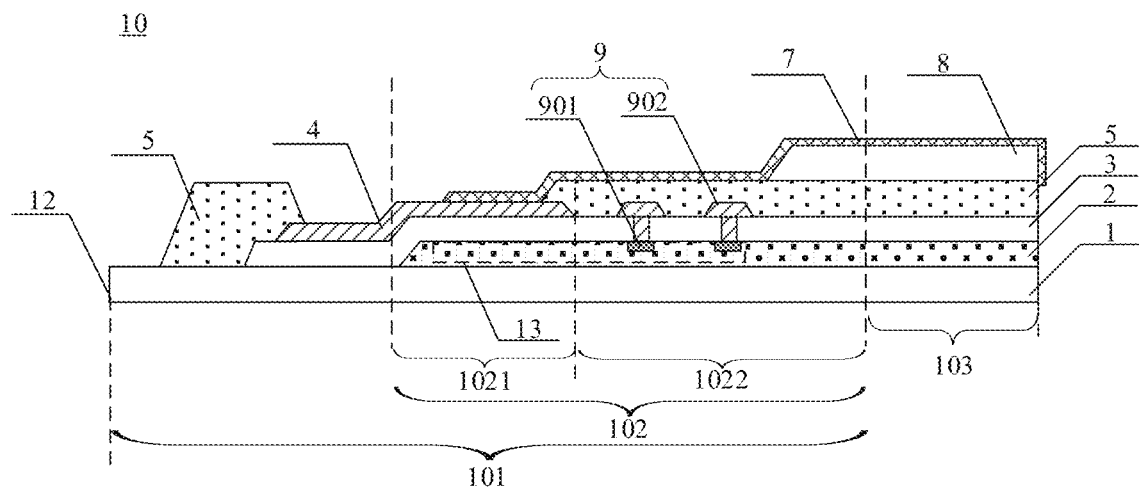
FIG. 4D is yet still another schematically sectional view taken along the line H-H' in FIG. 3.

For example, FIG. 3 is a schematic plan view of a substrate provided by an embodiment of the present disclosure, FIG. 4A is an exemplarily schematic sectional view taken along a line H-H' in FIG. 3, FIG. 4B is another exemplarily schematic sectional view taken along the line H-H' in FIG. 3, FIG. 4C is still another exemplarily schematic sectional view taken along the line H-H' in FIG. 3, and FIG. 4D is yet still another exemplarily schematic sectional view taken along the line H-H' in FIG. 3.

Exemplarily, as shown in FIG. 4A, the substrate 10 includes a base substrate 1 and a common electrode lead 4. The base substrate 1 includes a working region 103, a non-working region 101 outside of the working region 103 and an outer profile edge 12. That is, the non-working region 101 is located on a side of the working region 103 near the outer profile edge 12 of the base substrate 1. The outer profile edge 12 refers to an outer border of the base substrate 1. For example, the non-working region 101 includes a peripheral circuit region 102 near the working region 103 and a non-circuit region away from the working region 103. For example, the working region 103 may be a display region or a light-emitting region, etc., and accordingly, the non-working region 101 may be a non-display region or a non-light-emitting region, etc. The non-working region 101, for example, may have circuits, pads, interconnection structures and so on for supporting and implementing display, light emission and other functions provided therein, although it is not used for display, light emission, etc.

A circuit layer 2 is provided on the base substrate 1. The circuit layer 2 includes a peripheral circuit 13 (the structure of which is not specifically shown in FIG. 4A) located in the peripheral circuit region 102, for controlling the working state of a working unit within the working region 103. For example, when the working unit is a light-emitting unit, the peripheral circuit 13 may be used to control whether the light-emitting unit emits light, or not, and the emitted light intensity. The peripheral circuit 13 may, for example, be a driving circuit, such as a gate driving circuit, etc. The present embodiment does not limit the type and concrete structure of the peripheral circuit 13.

As shown in FIG. 3 and FIG. 4A, for example, the common electrode lead 4 is arranged along the outer profile edge 12 of the base substrate 1. In other embodiment of the present disclosure, the common electrode lead 4 may be arranged along a portion of the outer profile edge 12 of the base substrate 1. For example, the orthographic projection of the common electrode lead 4 on the base substrate 1 partially coincides with the orthographic projection of the peripheral circuit region 102 on the base substrate 1. For example, a portion of the common electrode lead 4 is located in the peripheral circuit region 102, and the other portion of the common electrode lead 4 is located in a non-circuit region of the non-working region 101. The orthographic projection of the common electrode lead 4 on the base substrate 1 partially coincides with the orthographic projection of the peripheral circuit region 102 on the base substrate 1. For example, the orthographic projection of the common electrode lead 4 on the base substrate 1 partially coincides with the orthographic projection of the peripheral circuit 13 on the base substrate 1. That is, in a direction perpendicular to the base substrate 1, a portion of the common electrode lead 4 coincides with a portion of the peripheral circuit 13. For another example, the peripheral circuit 13 includes a plurality of circuit elements (e.g., thin film transistors, lead wires, etc.) and a spacer zone between the plurality of circuit elements, and the orthographic projection of the common electrode lead 4 on the base substrate 1 coincides with the orthographic projection of the spacer zone on the base substrate 1. Also, the common electrode lead 4 is insulated from the peripheral circuit 13. Compared with the substrate shown in FIG. 2, the width occupied by the common electrode lead 4 alone in the non-working region 101 can be reduced in the substrate 10 provided by an embodiment of the present disclosure, and when the peripheral circuit structure is applied to a substrate, panel or display device, the bezel around a working region can be narrowed (width of the bezel in a direction perpendicular to the common electrode lead is reduced). Or, due to the fact that a portion of the common electrode lead 4 overlaps with a portion of the peripheral circuit 13 and thus that portion of space occupied by the common electrode lead 4 is reduced, it is conducive to increasing the width of the common electrode lead 4, so as to reduce the resistance of the common electrode lead 4. In this way, on the one hand, it is propitious in improvement of the transmission speed of signal in the common electrode lead, in addition, it is conductive to reducing the power consumption and generated joule heat of the common electrode lead during operation, and to reducing the temperature rise caused by the joule heat. Consequently, it is propitious for improvement of lifetime of a device to which the substrate's peripheral circuit structure is applied, fir example, a display device.

It is to be noted that the width of the common electrode lead 4 in the embodiment of this disclosure refers to size of a dimension h in a direction perpendicular to the outer profile edge 12 as shown in FIG. 3.

For example, the substrate 10 may further include a common electrode 7, which extends from the working region 103 to the peripheral circuit region 102, and is electrically connected to the common electrode lead 4. In this way, a common electrical signal (voltage) is transmitted to the common electrode 7 via the common electrode lead 4, so as to control or drive the working state of the working region 103.

For example, as shown in FIG. 3 and FIG. 4A, the substrate 10 may further include a bridging conductive layer 6, which is located in a non-working region 101 (e.g., in a peripheral circuit region 102) and insulated from the peripheral circuit 13. The bridging conductive layer 6 extends across the peripheral circuit 13 and electrically connects the common electrode lead 4 with the common electrode 7. For example, a portion of the common electrode 7 may be situated in the 3 non-working region 101 and extend from the 3 non-working region 101 to the working region 103. One end of the common electrode 7 away from the working region 103 is electrically connected to the bridging conductive layer 6. For example, one end of the common electrode 7 away from the working region 103 may be in direct contact with one end of the bridging conductive layer 6 near the working region 103 so as to achieve electrical connection. That is, the common electrode 7 directly overlaps with the bridging conductive layer 6 so as to realize electrical connection between the common electrode 7 and the bridging conductive layer 6. At the same time, the bridging conductive layer 6 is electrically connected to the common electrode lead 4, so as to electrically connect the common electrode lead 4 to the common electrode 7 by the bridging conductive layer 6. For example, one end of the bridging conductive layer 6 away from the working region 103 directly overlaps with the common electrode lead 4, so as to achieve electrical connection between the bridging conductive layer 6 and the common electrode lead 4. This direct overlapping is beneficial to the reduction of the contact resistance and is easy to fabricate it. Generally, the common electrode 7 may be formed by chemical vapor deposition or magnetron sputtering, or the like, the bridging conductive layer 6 may be formed by photolithography, while the dimensional accuracy of a film layer formed by chemical vapor deposition or magnetron sputtering is lower than that of a photolithography process, and it generally need to reserve a sufficient packaging space previously in a place of the non-working region 101 on the periphery of a substrate that is near the outer profile edge 12 of the base substrate 1. If the common electrode 7 is made to directly overlap with the common electrode lead 4, it needs more packaging space to be reserved previously. By provision of the bridging conductive layer, the dimensional accuracy in the case that a packaging space is reserved previously can be improved. In this way, it is further conducive to the realization of narrower bezel.

In the substrate's peripheral circuit structure provided by an embodiment of the present disclosure, the common electrode lead 4 may also be arranged along a portion of the outer profile edge 12 of the base substrate 1. The orthographic projection of the common electrode lead 4 on the base substrate 1 partially coincides with the orthographic projection of the peripheral circuit region 102 on the base substrate 1, and this is also beneficial to the reduction of the width of the bridging conductive layer 6, so as to beneficial to reducing the resistance of the bridging conductive layer 6. In this way, on the one hand, it is propitious for the improvement of the transmission speed of a signal in the bridging conductive layer, in addition, it is conductive to reducing the power consumption and the generated Joule heat of the bridging conductive layer during operation, and to reducing temperature rise caused by the Joule heat. Consequently, it is beneficial to the improvement of lifetime of a device, to which the substrate's peripheral circuit structure is applied, for example, for a display device. The width of the bridging conductive layer 6 refers to the width of the bridging conductive layer 6 in a direction where the above dimension h lies.

For example, the bridging conductive layer 6, the common electrode lead 4 and the common electrode 7 include material, which is a transparent conductive material, or an opaque conductive material, and the transparent conductive material, for example, may be indium tin oxide (ITO), indium zinc oxide (IZO), or the like, and the opaque conductive material, for example, may be a metallic material, such as copper, aluminum, a copper alloy, an aluminum alloy, or the like, with higher conductivity. The bridging conductive layer 6 and common electrode lead 4 adopt the above materials or materials of other kinds with higher conductivity, and this is beneficial to the improvement of the transmission speed of a common signal. For example, when the working region 103 is a light-emitting region, and light needs to exit from the common electrode 7 side in FIG. 4A, the common electrode 7 made of a transparent material.

The material types listed above are only exemplary embodiments. Embodiments of the present disclosure do not limit materials of the bridging conductive layer, the common electrode lead, and the common electrode, and those skilled in the art can choose according to specific needs.

For example, the peripheral circuit 13 may include an external connection portion 9, and the external connection portion 9 includes an external connection joint 901 and an external connection lead 902. The peripheral circuit 13 may include an internal connection portion and the external connection portion 9. The internal connection portion refers to a conductive structure and so on formed by interconnection of various components of the peripheral circuit 13. For example, the peripheral circuit 13 is a driving circuit, such as a gate driving circuit, or a data driving circuit. Exemplary description will be made below by taking the peripheral circuit 13 being a gate driving circuit as an example, and the gate driving circuit is of GOA type. The internal connection portion includes leads inside each driving unit of the gate driving circuit, leads between driving units, and interconnection parts between thin film transistors and capacitors. The external connection portion 9 includes a portion of the peripheral circuit 13 connected to its external signal transmission structure. For example, the external connection portion 9 includes an external connection joint 901 connected to a plurality of drive units of a gate driving circuit and an external connection lead 902, and the external connection lead 902 can be used to electrically connect the external connection joint 901 with the external signal transmission structure. For example, the external connection portion 9 may be used for connection to a timing controller.

For example, the orthographic projection of the external connection joint 901 on the base substrate 1 does not coincide with the orthographic projection of the common electrode lead 4 on the base substrate 1. For example, the peripheral circuit region 102 includes a first zone 1021 away from the working region 103 and a second zone 1022 near the working region. The external connection joint 901 is arranged in the second zone 1022 of the peripheral circuit region 102. For example, the second zone 1022 does not overlap with the common electrode lead 4 in a direction perpendicular to the base substrate 1, so that the orthographic projection of the external connection joint 901 on the base substrate 1 does not coincide with the orthographic projection of the common electrode lead 4 on the base substrate 1. In this way, it is convenient to form a via hole over the external connection joint 901 and to arrange the external connection lead 902, so that this process will not be hindered by the common electrode lead 4.

For example, the substrate 10 may further include an interlayer insulating layer 3 arranged between the peripheral circuit 13 and the common electrode lead 4, and the interlayer insulating layer 3 covers the peripheral circuit 13 so that the peripheral circuit 13 is insulated from the common electrode lead 4. For example, material of the interlayer insulating layer 3 may be an organic insulating material, such as resin, and rubber, and may also be an inorganic insulating material, such as silicon nitride. Material of the interlayer insulating layer 3 is not limited to the above listed types, and embodiments of the present disclosure do not limit them.

For example, the interlayer insulating layer 3 includes a via hole exposing the external connection joint 901 of the peripheral circuit 13, through which the external connection lead 902 is electrically connected to the external connection joint 901 of the peripheral circuit 13. For example, the external connection lead 902 may be electrically connected to an external controller, such as a timing controller, so that the external controller and the peripheral circuit can be used for joint control of the working state of the working region 103, for example, for control of the turn-on and turn-off of work units of the work region 103, execution of progressive scanning, and so on.

For example, the external connection lead 902 may be of a same material and arranged in a same layer as the common electrode lead 4. This is conducive to simplifying the structure and simplifying the manufacturing process. Material of the external connection lead 902 may refer to the previous description about the material of the common electrode lead 4.

It is to be noted that, in this disclosure, the external connection lead and the common electrode lead being arranged in the same layer refers to that the external connection lead and the common electrode lead may be formed by a same patterning process with the same mask, and the external connection lead and the common electrode lead are in contact with a same layer. For example, in FIG. 4A, both the external connection lead 902 and the common electrode lead 4 contact the interlayer insulating layer 3.

For example, the substrate 10 may further include a planarization layer 5 covering the peripheral circuit 13 and a portion of the common electrode lead 4, for providing a flat surface for arrangement of functional devices in the working region 103 while insulation of the external connection portion 9 of the peripheral circuit 13 from the bridging conductive layer 6 and the common electrode 7 located above the planarization layer is achieved. The planarization layer 5 exposes a portion of the common electrode lead 4, so that the bridging conductive layer 6 can be electrically connected to the common electrode lead 4.

For example, in the embodiment shown in FIG. 4A, at a side of the interlayer insulating layer 3 near the outer profile edge 12 of the base substrate 1, a step portion is formed, and the common electrode lead 4 covers the step portion, and extends from a lower position relative to the base substrate 1 to a higher position relative to the base substrate 1. In other embodiment of the present disclosure, no this step portion is provided. For example, in the embodiment shown in FIG. 4B, the interlayer insulating layer 3 has a flat surface on a side near the outer profile edge of the base substrate 1, and in this case, the common electrode lead 4 is arranged on the flat surface.

The above embodiment is the case where a portion of the common electrode lead 4 overlaps with the first zone 1021 of the peripheral circuit region 102 in a direction perpendicular to the base substrate 1, and in another embodiment of the present disclosure, as shown in FIG. 4C, the entire common electrode lead 4 overlaps with the peripheral circuit 13 in a direction perpendicular to the base substrate 1. That is, the orthographic projection of the common electrode lead 4 on the base substrate 1 falls within the orthographic projection of the peripheral circuit 13 on the base substrate 1. In this way, width of the non-working region 101 can be further reduced, and the bezel width of a device, to which the substrate's peripheral circuit structure 10 is applied, such as a display device, is further reduced.

In still another embodiment of the present disclosure, as shown in FIG. 4D, the common electrode 7 and the bridging conductive layer 6 may also be an integral structure to realize electrical connection between the common electrode 7 and the common electrode lead 4. It can be understood that the common electrode 7 and the common electrode lead 4 may overlap directly to realize electrical connection between them, while no bridging conductive layer 6 is provided.

In the embodiment shown in FIGS. 4A to 4D, the external connection joint 901 is disposed on a side of the common electrode lead 4 away from the outer profile edge 12 of the base substrate 1.

Figure 4E:
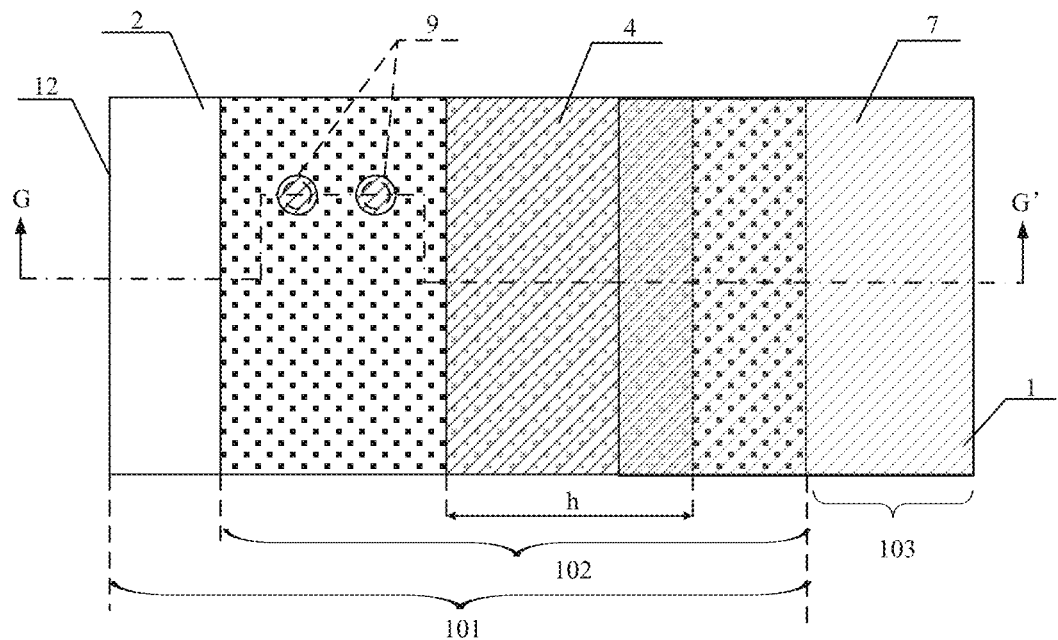
FIG. 4E is a schematic plan view of another substrate provided by an embodiment of this disclosure.
Figure 4F:
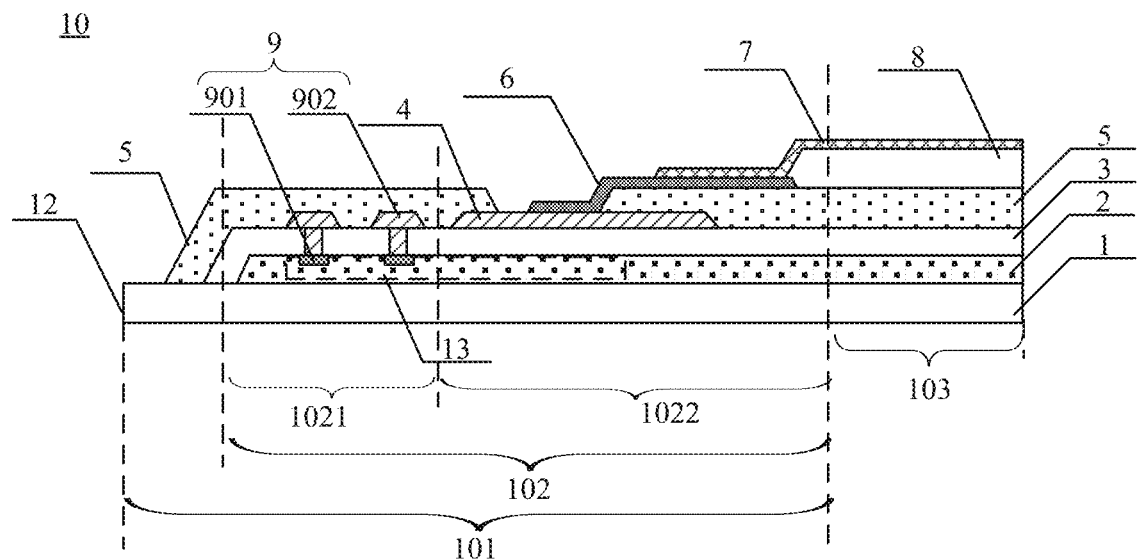
FIG. 4F is a schematically sectional view taken along a line G-G' in FIG. 4E.

In another embodiment, an external connection joint may also be located on a side of a common electrode lead near the outer profile edge of a base substrate. FIG. 4E is a schematic plan view illustrating another substrate's peripheral circuit structure provided by an embodiment of the present disclosure; FIG. 4F is a schematically sectional view taken along a line G-G' in FIG. 4E. For example, as shown in FIG. 4F, an external connection joint 901 is disposed on a side of a common electrode lead 4 near the outer profile edge of a base substrate 1, that is, the connection joint 901 is disposed between the common electrode lead 4 and the outer profile edge of the base substrate 1. Compared with the embodiment shown in FIG. 4A-4D, the length of the bridging conductive layer 6 can be further reduced by the embodiment shown in FIG. 4F, and the resistance of the bridging conductive layer 6 is further reduced. Other technical effects brought about by the embodiment shown in FIG. 4F can refer to the above descriptions, and no details are repeated here.

Figure 4G:
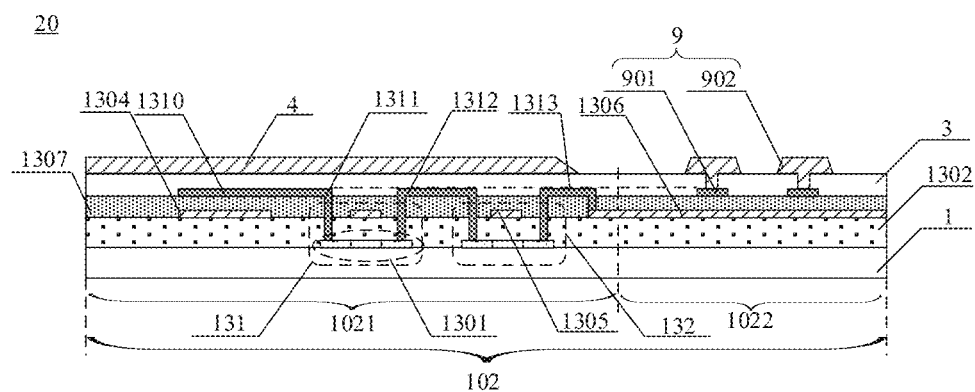
FIG. 4G is a schematically partial enlarged view of a peripheral circuit in FIG. 4A.

FIG. 4G is a schematically partial enlarged view of a peripheral circuit in FIG. 4A. Exemplarily, as shown in FIG. 4G, the peripheral circuit 13 may include a plurality of thin film transistors arranged on the base substrate 1, for example, a first thin film transistor 131 and a second thin film transistor 132. Each of the first thin film transistor 131 and the second thin film transistor 132 includes a first portion 1301 and a gate electrode 1305. A source electrode, a drain electrode, and a channel area are included in each of the first portions 1301 of the first thin film transistor 131 and the second thin film transistor 132. The peripheral circuit 13 may further include a first insulating layer 1302 covering the first portions 1301 of the first thin film transistor 131 and the second thin film transistor 132, a capacitor and a peripheral circuit signal output lead 1306. The peripheral circuit signal output lead 1306 is configured to output an output signal of the peripheral circuit to the working region on an inner side of the non-working region. For example, when the peripheral circuit 13 is a GOA driving circuit, a gate driving signal (a progressive scanning signal) is outputted from the peripheral circuit signal output lead 1306. The capacitor includes a first plate 1304 and a second plate 1310 disposed to be opposed. For example, the gate electrode 1305 of thin film transistor, the first plate 1304 of the capacitor and the peripheral circuit signal output lead 1306 are arranged in a same layer, and each of them is disposed on the first insulating layer 1302. They may be made of a same material, and may be formed simultaneously by a same process. For example, they are formed by a same patterning process with a same mask. The peripheral circuit may further include a second insulating layer 1307 covering the gate electrode 1305, the first plate 1304 of the capacitor and the peripheral circuit signal output lead 1306. The first insulating layer 1302 and the second insulating layer 1307 contain second via holes exposing source electrodes or drain electrodes of the thin film transistors.

For example, the peripheral circuit 12 further includes an internal connection portion including a connecting line, and for example, the connecting line includes a first portion 1311, a second portion 1312 and a third portion 1313. The second plate 1310 of the capacitor, the connecting line and the external connection joint 901 are arranged on the second insulating layer 1307. A drain electrode of the first thin film transistor 131 is electrically connected to a source electrode of the second thin film transistor 132 by the second portion 1312 of the connecting line through a second via hole. The second plate 1310 of the capacitor is electrically connected to a source electrode of the first thin film transistor 131 by the first portion 1311 of the connecting line through a second via hole. Furthermore, the second plate 1310 of the capacitor and the connecting line 1311 may be formed integrally, and they can be formed of a same material simultaneously by a same patterning process with a same mask. A drain electrode of the second thin film transistor 132 is electrically connected to the peripheral circuit signal output lead 1306 by the third portion 1313 of the connecting line. In addition, the external connection joint 901, the second plate 1310 of the capacitor and the connecting line are disposed in a same layer.

It is to be noted that 'being disposed in the same layer' in the present disclosure refers to that structures disposed in the same layer may be formed from the same material simultaneously by the same patterning process with the same mask, and in contact with a same layer, which does not refer to that height of these structures relative to the base substrate is the same. For example, the external connection joint 901, the second plate 1310 of the capacitor and the connecting line are made of a same material, and formed from a same film layer simultaneously by a same patterning process with a same mask, and the external connection joint 901, the second plate 1310 of the capacitor and the connecting line are all in contact with the second insulating layer 1307, so as to simplify structure of the peripheral circuit and fabrication process.

For example, material of the external connection joint 901, the second plate 1310 of the capacitor and the connecting line may be copper, aluminum, a copper alloy, an aluminum alloy, silver, chromium, or the like, but is not limited to the above listed categories. Embodiments of the present disclosure do not set a limit to the material of components, and those skilled in the art can make a reference to a common technique.

In the substrate provided by an embodiment of the present disclosure, the entire peripheral circuit 13 is located below the interlayer insulating layer 3, that is, the interlayer insulating layer 3 covers the peripheral circuit 13. For example, the interlayer insulating layer 3 covers the external connection joint 901, the second plate 1310 of the capacitor and the connecting line, etc. In this way, a flat insulating layer can be formed on the peripheral circuit 13, and when a common electrode lead 4 is arranged on an interlayer insulating layer 3, and the common electrode lead 4 partially or even completely overlaps with a peripheral circuit below the interlayer insulating layer 3, insulation of the common electrode lead 4 from the peripheral circuit 13 can be achieved.

Figure 5A:
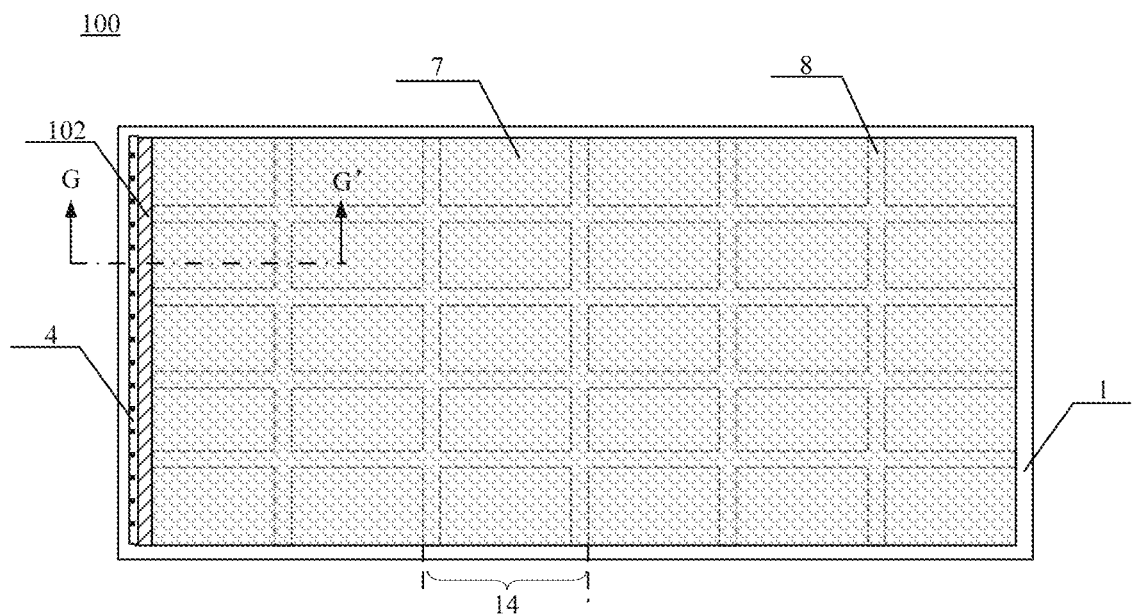
FIG. 5A is a schematic plan view of an array substrate provided by an embodiment of the present disclosure.
Figure 5B:
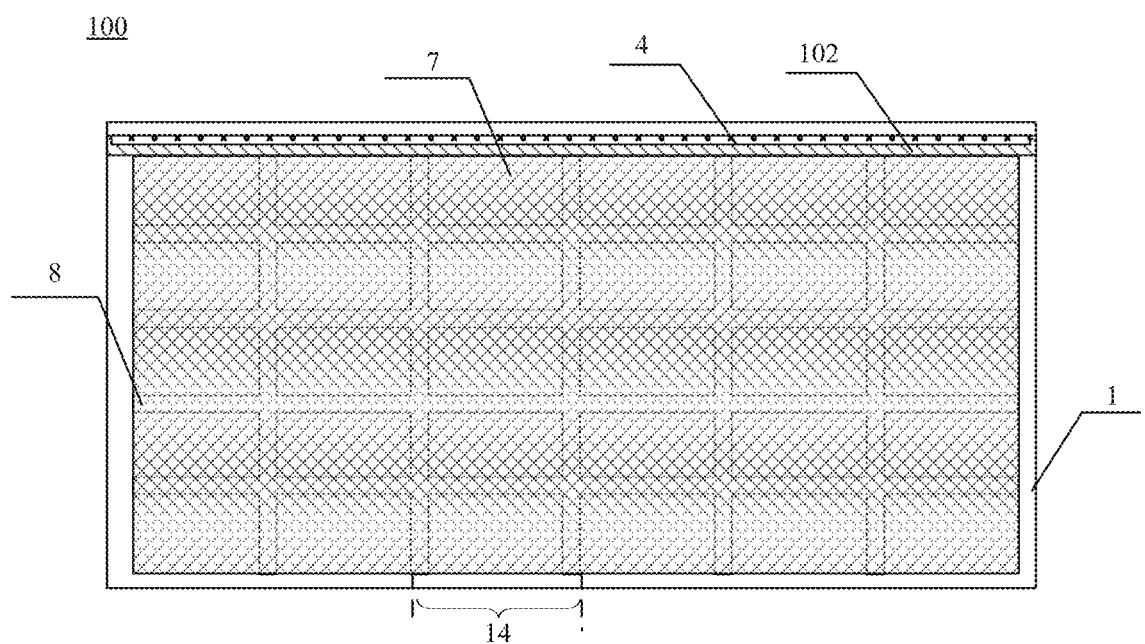
FIG. 5B is a schematic plan view of another array substrate provided by an embodiment of the present disclosure.
Figure 5C:
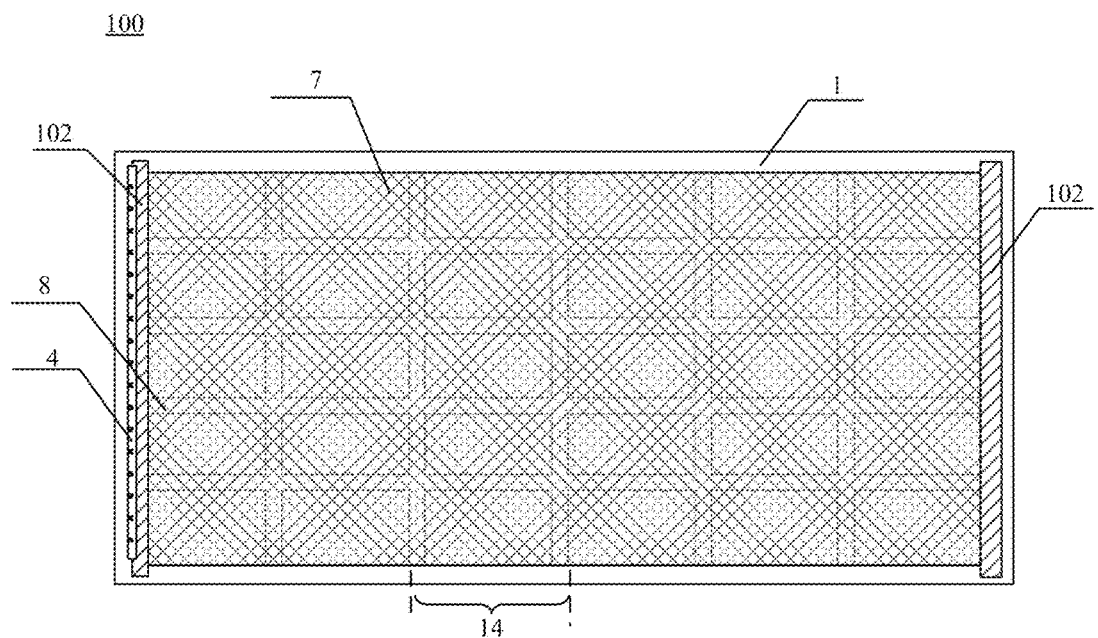
FIG. 5C is a schematic plan view of still another array substrate provided by an embodiment of the present disclosure.

For example, the substrate provided by an embodiment of the present disclosure may be an array substrate, or a display substrate, etc. FIG. 5A is a schematic plan view of an array substrate provided by an embodiment of the present disclosure, FIG. 5B is a schematic plan view of another array substrate provided by an embodiment of the present disclosure, FIG. 5C is a schematic plan view of still another array substrate provided by an embodiment of the present disclosure; and FIG. 6 is a schematically sectional view taken along a line G-G' in FIG. 5A.

For example, as shown in FIG. 5A, a common electrode lead 4 and a peripheral circuit of a peripheral circuit region 102 are used to control the working state of a working region 103. The common electrode lead 4 and the peripheral circuit region 102 may be in a place on the left side of an array substrate 100 near its outer profile edge, and a control signal is input from the left side to the working region 103. For example, as shown in FIG. 5B, a common electrode lead 4 and a peripheral circuit region 102 may also be arranged in a place on the upper side of an array substrate 100 near its outer profile edge, and a control signal is input from the upper side to a working region 103. For another example, as shown in FIG. 5C, a common electrode lead 4 and a peripheral circuit region 102 may also be arranged in a place on opposite sides of an array substrate 100, such as on the left side and the right side, near its outer profile edge. In this way, control signals can be input to a working region 103 at two sides at the same time, and a technical effect of reducing signal delay can be achieved. In this way, a better working effect is achieved by the array substrate 100. For the case that the planar area of an array substrate 100 is larger, this technical effect is more significant. It is to be noted that terms "left", "right", "upper" in the embodiments of this disclosure refer to the relative locations shown in corresponding drawings.

For example, the working region is provided with a display element therein, and the display element includes a pixel defining layer, a light emitting layer, a first electrode and a second electrode. The pixel defining layer includes a plurality of openings; the light emitting layer is disposed in the plurality of openings; the first electrode covers the pixel defining layer and the light emitting layer, and extends from the display region toward the first common electrode lead; and the second electrode is arranged between the base substrate and the light emitting layer. The first electrode is a common cathode, and the first common electrode lead is a common cathode lead; or the first electrode is a common anode, and the first common electrode lead is a common anode wire.

Figure 6:
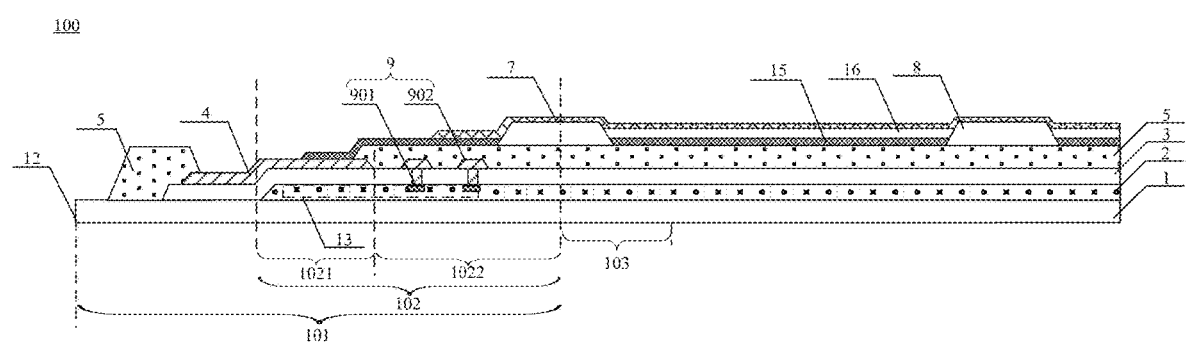
FIG. 6 is a schematically sectional view taken along a line G-G' in FIG. 5A.

For example, as shown in FIG. 6, the working region 103 is provided with a plurality of array elements 14, and the plurality of array elements include a common electrode 7, and the common electrode 7 is electrically connected to a common electrode lead 4. For example, the array elements 14 may be an organic light-emitting diode device, and the organic light-emitting diode device may be a top emission configuration, a bottom emission configuration, or other configuration. Exemplarily, the organic light-emitting diode device may include an anode 15 arranged on a base substrate 1, a cathode disposed on the base substrate 1 to be opposed to the anode 15, and an organic light-emitting layer 16 arranged between the anode 15 and the cathode. In the embodiment shown in FIG. 6, the cathode is a common electrode 7, and in this case, the common electrode lead 4 is a common cathode lead, the first electrode is a cathode (i.e., the common cathode), the second electrode is an anode, and a low-level signal is input to the common electrode 7 during the operation. For example, the anode 15 may be a reflective electrode, or a reflective layer (not shown in the figure) is disposed to be adjacent to the anode 15, and lights are exited from the cathode side during operation. Alternatively, the cathode may be a reflective electrode, or a reflective layer is provided to be adjacent to the cathode, and lights are exited from the anode side during operation. In other embodiment of the present disclosure, positions of the anode and the cathode are exchangeable. For example, the anode may be a common electrode 7. In this case, the common electrode lead 4 is a common anode lead, the first electrode is an anode (i.e., the common anode), the second electrode is a cathode, and a high-level signal is input to the common electrode 7 during operation.

For example, the organic light-emitting diode device may further include a pixel defining layer 8 to define a plurality of light-emitting units or pixel units, so that crosstalk between lights from adjacent light-emitting units or adjacent pixel units is prevented. The pixel defining layer 8 includes a plurality of openings, the organic light-emitting layer 16 is arranged in the openings, and the common electrode 7 may cover the pixel defining layer 8.

For example, the perimeter circuit 13 may be a gate driving circuit, or a data driving circuit, etc. For example, the gate driving circuit or the data driving circuit includes thin film transistors, capacitors, gate-line leads or data-line leads, etc.

The array substrate provided by an embodiment of the disclosure can be used for electronic devices, such as display devices, illuminating devices, or the like. In the array substrate provided by the embodiment of the present disclosure, width occupied by the common electrode lead 4 alone in the non-working region 101 is reduced, so that the array substrate has a narrower bezel. In this way, a narrower bezel can be realized by a display device, an illuminating device, or the like, which adopt the array substrate. A narrower bezel can be realized by a display device, an illuminating device, or the like, which adopt the array substrate. While a narrow bezel is realized, the saved space can be used to increase width of a common electrode lead, so as to reduce the resistance of the common electrode lead. In this way, the resistance of the common electrode lead can be reduced. On the one hand, it is propitious for the improvement of the transmission speed of a signal in the common electrode lead, in addition, it is helpful to reducing the power consumption and the generated Joule heat of the common electrode lead during the operation, and to reducing temperature rise caused by the Joule heat. Consequently, it is beneficial to the improvement of the lifetime of the array substrate, the display device, or the illuminating device.

Figure 7:
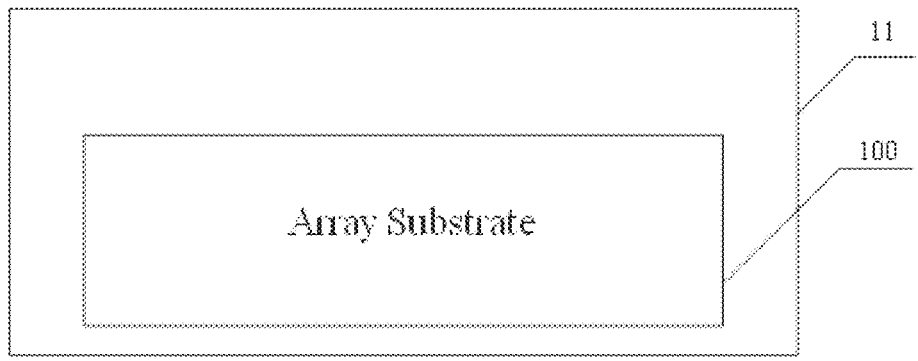
FIG. 7 is a schematic diagram illustrating a display device provided by an embodiment of the present disclosure.

At least one embodiment of the present disclosure also provides an electronic device, which includes any of the substrates provided by embodiments of the present disclosure. For example, the electronic device may be a display device, an illuminating device, etc. Exemplarily, FIG. 7 is a schematic diagram of a display device provided by an embodiment of the present disclosure. As shown in FIG. 7, the display device includes any of the array substrates provided by the embodiments of the present disclosure. For example, the display device may be an organic light-emitting diode display device. For example, the display device may be implemented as the following products: a mobile phone, a tablet computer, a television, a display, a notebook computer, a digital photo frame, a navigator, or any other product or component with display function.

FIG. 7 is only a schematic diagram of a display device that includes any of the array substrates provided in embodiment 2. For other structures of the display device that are not shown, reference can be made to conventional techniques by those skilled in the art, and embodiments of the present disclosure do not limit them.

A narrower bezel can be achieved by the display device provided by an embodiment of the present disclosure. While a narrow bezel is realized, it is also beneficial to increasing width of a common electrode lead, so as to reduce the resistance of the common electrode lead. In this way, the resistance of the common electrode lead can be reduced. On the one hand, it is propitious for the improvement of the transmission speed of signal in the common electrode lead, in addition, it is beneficial to reducing power consumption and the generated joule heat of the common electrode lead during operation, to reducing the temperature rise caused by the Joule heat. Consequently, it is beneficial to the improvement of the lifetime of an array substrate, a display device, or an illuminating device.

At least one embodiment of the present disclosure also provides an array substrate manufacturing method, including: providing a base substrate including a working region, a non-working region outside of the working region and an outer profile edge, the non-working region including a peripheral circuit region near the working region and a non-circuit region away from the working region; a peripheral circuit is formed in the peripheral circuit region of the non-working region; and a common electrode lead extending along at least part of the outer profile edge of the base substrate is formed. The peripheral circuit region is provided with the peripheral circuit, the peripheral circuit is not provided in the non-circuit region, the orthographic projection of the common electrode lead on the base substrate at least partially coincides with the orthographic projection of the peripheral circuit region on the base substrate, and the common electrode lead is insulated from the peripheral circuit.

Exemplarily, FIGS. 8A to 8M are schematic diagrams illustrating an array substrate manufacturing method provided by an embodiment of the present disclosure. An exemplary introduction will be given below with reference to an example in which an array substrate with an organic light-emitting diode (OLED) device being included in a working region is formed.

Figure 8A:
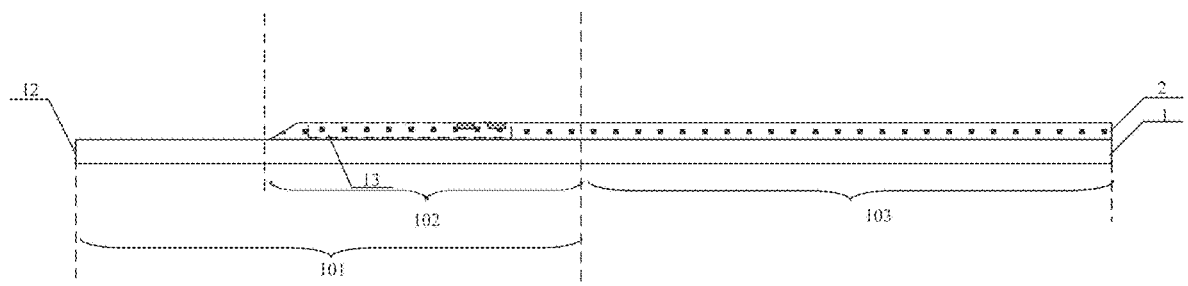
FIGS. 8A to 8L are schematic diagrams illustrating a manufacturing method of an array substrate provided by an embodiment of the present disclosure.

As shown in FIG. 8A, a base substrate 1 is provided. The base substrate 1 may be, for example, a glass substrate, a quartz substrate, a resin (e.g. polyethylene) substrate, etc. The base substrate 1 has an outer profile edge 12 and includes a working region 103 and a non-working region 101 outside of the working region 103. The non-working region 101 includes a peripheral circuit region 102 near the working region 103. A circuit layer 2 is formed on the base substrate 1, which includes forming a peripheral circuit 13 in the peripheral circuit region 102. The peripheral circuit 13 may, for example, be a driving circuit, such as a gate driving circuit, or a data driving circuit. The manufacturing method of the circuit will be exemplarily introduced below by taking the peripheral circuit 13 being a gate driving circuit as an example.

FIGS. 9A to 9F are schematic diagrams illustrating a manufacturing method of the driving circuit. Forming the peripheral circuit 13 includes forming an internal connection portion and an external connection portion of the peripheral circuit 13. The external connection portion includes an external connection joint and an external connection lead, and the orthographic projection of the external connection joint on the base substrate 1 does not coincide with the orthographic projection of a common electrode lead 4 on the base substrate 1. For example, the peripheral circuit region 102 includes a first zone 1021 away from the working region 103 and a second zone 1022 near the working region 103. The internal connection portion is disposed in the first zone 1021 of the peripheral circuit region 102, and the external connection joint is formed within the second zone 1022 of the peripheral circuit region 102. For example, the first zone 1021 does not coincide with the common electrode lead 4 in a direction perpendicular to the base substrate 1, so that the orthographic projection of the external connection joint on the base substrate 1 does not coincide with the orthographic projection of the common electrode lead 4 on the base substrate 1. Description will be made below by taking formation of thin film transistors as an example.

Forming the peripheral circuit includes forming a plurality of thin film transistors, such as forming a first thin film transistor and a second thin film transistor. A gate electrode, a source electrode, and a drain electrode are included in each of the first thin film transistor and the second thin film transistor.

Figure 9A:
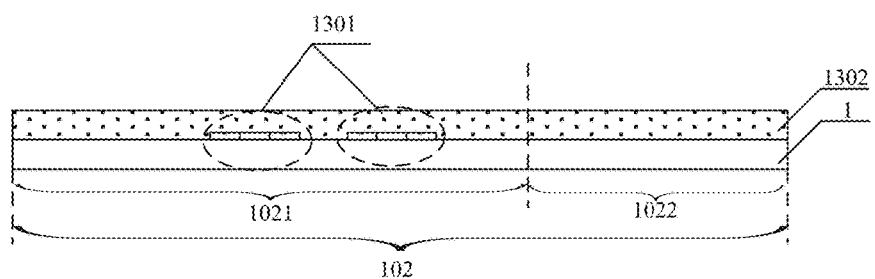
FIGS. 9A to 9F are schematic diagrams illustrating a manufacturing method for a driving circuit of an array substrate provided by an embodiment of the present disclosure.

As shown in FIG. 9A, a plurality of first portions 1301 and a first insulating layer 1302 are formed in the first zone 1021 using conventional techniques in the field. A first portion 1301 includes a channel area, a source area, and a drain area.

Figure 9B:
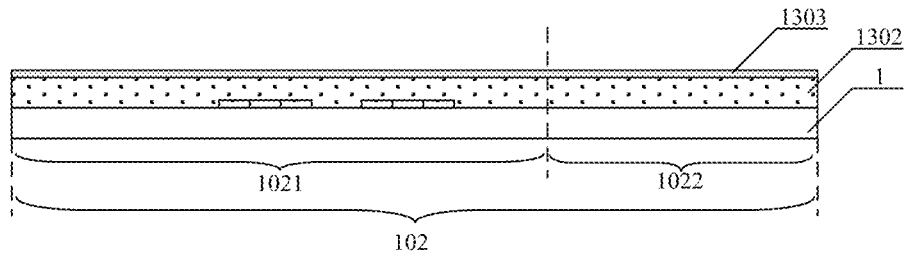

As shown in FIG. 9B, a gate metal layer 1303 is formed on the first insulating layer 1302, and for example, the gate metal layer 1303 may be formed by chemical vapor deposition, magnetron sputtering, or the like. Material of the gate metal layer 1303 may be copper, aluminum, a copper alloy, an aluminum alloy, silver, chromium, or the like, but is not limited to the above listed categories.

Figure 9C:
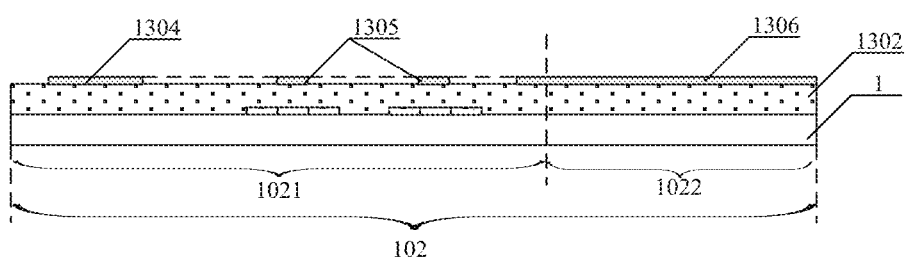

Forming the peripheral circuit includes forming a gate-metal-layer pattern. For example, it may include forming gate electrodes of a plurality of thin film transistors, a first plate of a capacitor, a pattern of a connecting line between the gate electrodes of the plurality of thin film transistors and a pattern of a peripheral circuit output lead by a same patterning process with a same mask. As shown in FIG. 9C, the gate metal layer 1303 is patterned, to simultaneously form a pattern of a plurality of gate electrodes 1305 corresponding to first portions 1301 of the plurality of thin film transistors, respectively, the first plate 1304 of the capacitor, the plurality of gate electrodes 1305 and a peripheral circuit signal output lead 1306. For example, the patterning can be realized by a photolithographic process.

Figure 9D:
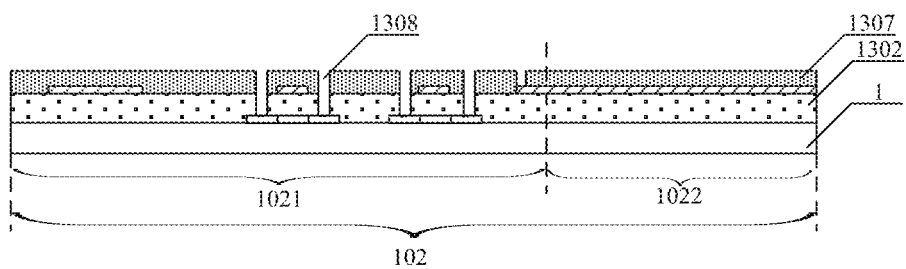

As shown in FIG. 9D, a second insulating layer 1307 covering a pattern formed by a gate metal layer 1303. Second via holes 1308 for exposing source electrodes and drain electrodes of a plurality of thin film transistors that are located in the first insulating layer 1302 and the second insulating layer 1307 are formed. For example, material of the first insulating layer 1302 and the second insulating layer 1307 may be an inorganic insulating material, such as silicon nitride, etc. In this case, the second via holes 1308 may be formed by a photolithographic process including exposure, development and etching. For example, material of the first insulating layer 1302 and the second insulating layer 1307 may be an inorganic insulating material or an organic insulating material, which may, for example, be a photosensitive organic insulating material. In this case, the second via holes 1308 may be formed by exposure-development process. In this way, the etching steps can be decreased, and the process can be simplified.

For example, the method further includes forming a second-metal-layer pattern, which may include forming a second plate of a capacitor, a connecting line of the peripheral circuit, and the external connection joint by a same patterning process with a same mask. The connecting line includes a first portion, a second portion and a third portion. The second plate of the capacitor is electrically connected to a source electrode of the first thin film transistor by the first portion of the connecting line. A drain electrode of the first thin film transistor is electrically connected with a source electrode of the second thin film transistor by the second portion of the connecting line. A drain electrode of the second thin film transistor is electrically connected with the peripheral circuit signal output lead by the third portion of the connecting line.

Figure 9E:
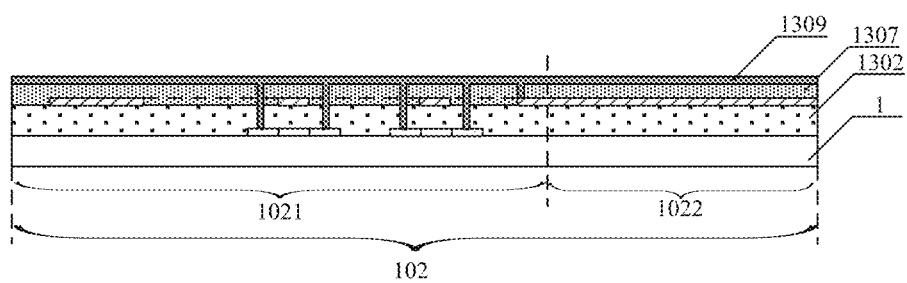

Exemplarily, as shown in FIG. 9E, a second metal layer 1309 is formed on the second insulating layer 1307, and the second metal layer 1309 is electrically connected to the source areas and drain areas of active layers of the thin film transistors through the second via holes 1308. For example, the second metal layer 1309 may be formed by chemical vapor deposition, magnetron sputtering, or the like. Material of the second metal layer 1309 may be copper, aluminum, a copper alloy, an aluminum alloy, silver, chromium, or the like, but is not limited thereto.

Figure 9F:
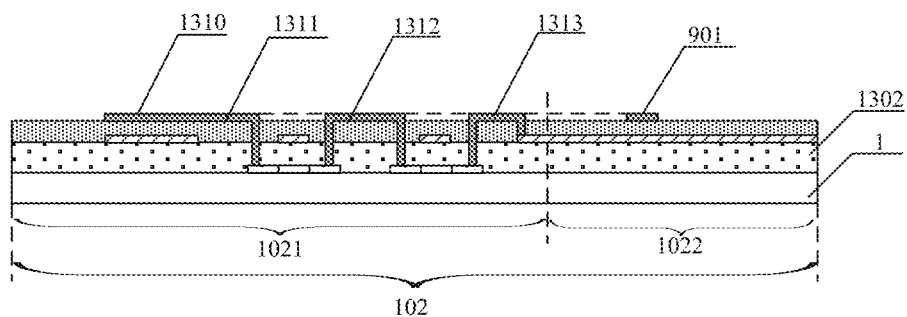

As shown in FIG. 9F, the second metal layer 1309 is patterned to simultaneously form a pattern of a second plate 1310 of a capacitor, a first portion 1311 of a connecting line for electrically connecting the second plate 1310 of the capacitor to a source electrode of the first thin film transistor, a second portion 1312 of the connection line that electrically connects a drain electrode of the first thin film transistor to a source electrode of the second thin film transistor, a third portion 1313 of the connecting line for electrically connecting a drain electrode of the second thin film transistor to the peripheral circuit signal output lead 1306 and an external connection joint 901.

For example, locating the external connection joint 901 in the second zone 1022 may be realized in the process of patterning the second metal layer 1309. For example, it may be electrically connected to source electrodes or drain electrodes of a plurality of thin film transistors in each row. It may also be used for connection to a controller outside of the gate driving circuit 13, for example, it may be connected to a timing controller, or the like. The peripheral circuit layer 2 shown in FIG. 8A may be formed by using the above method, and it is realized that an internal connecting portion of the peripheral circuit is formed in the first zone 1021 of the peripheral circuit region 102, and the external connection joint 901 is disposed in the second zone 1022 of the peripheral circuit region 102, so as to make preparation for the subsequent formation of an external connection portion of the peripheral circuit in the second zone 1022. With the method provided by an embodiment of the present disclosure, it is possible that after a part of devices (such as a second plate of a capacitor and an external connection joint) of the peripheral circuit and connection pattern between devices are simultaneously formed with the second metal layer 1309, it is unnecessary to separately form a metal used to connect the devices after formation of devices of the peripheral circuit, which is beneficial to the simplification of the process. It is to be noted that number/amount of the external connection joints 901 shown in FIG. 9F is one, which is merely acts as an exemplary description, and amount of the external connection joints 901 may be multiple.

Figure 8B:
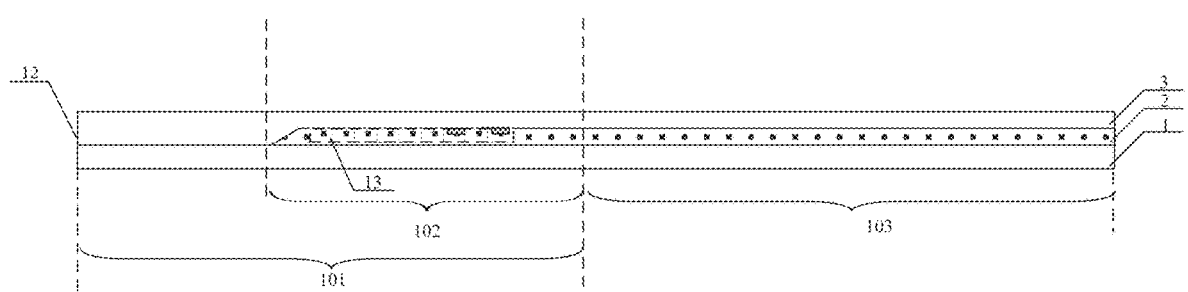

As shown in FIG. 8B, the method further includes forming an interlayer insulating layer 3 on the peripheral circuit layer 2. The whole peripheral circuit 13 is disposed below the interlayer insulating layer 3, that is, the interlayer insulating layer 3 covers the peripheral circuit 13. For example, the interlayer insulating layer 3 covers the external connection joint 901, the second plate 1310 of the capacitor, and the connecting line, etc. In this way, a flat insulating layer can be formed on the peripheral circuit 13. When a common electrode lead 4 is arranged on the interlayer insulating layer 3, and a portion or even the entirety of the common electrode lead 4 overlaps with the peripheral circuit under the interlayer insulating layer 3, the insulation of the common electrode lead 4 from the peripheral circuit 13 can be realized. Material of the interlayer insulating layer 3 may be the same as that of the first insulating layer 1302, which can refer to the above description. For example, the interlayer insulating layer 3 may be formed by a coating process, a deposition process, or the like.

Figure 8C:
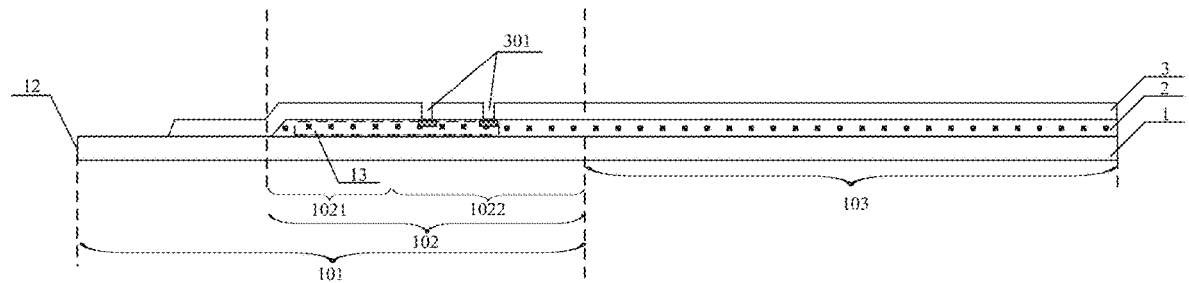

As shown in FIG. 8C, a via hole 301 exposing the external connection joint 901 is formed in the interlayer insulating layer 3. The specific method may refer to the above description about the method for forming the second via hole 1308.

Figure 8D:
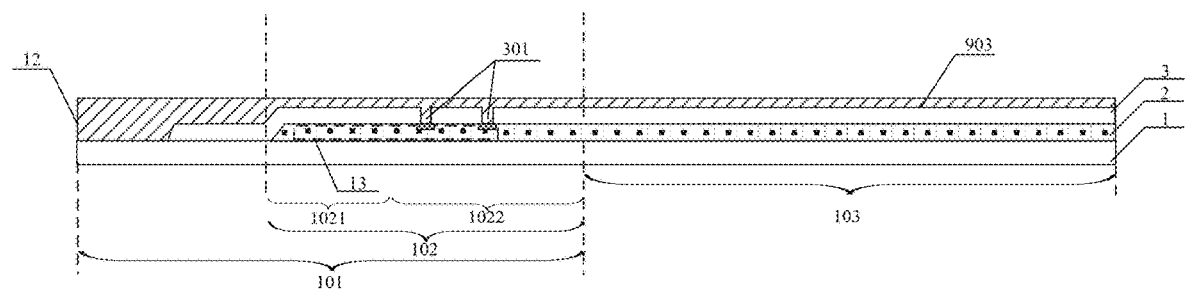

As shown in FIG. 8D, a common electrode lead layer 901 is formed on the interlayer insulating layer 3. Material of the common electrode lead layer 901 may, for example, be a transparent conductive material or an opaque conductive material. The transparent conductive material may be material, such as indium tin oxide (ITO), indium zinc oxide (IZO), or the like, and the opaque conductive material may, for example, be a metallic material, such as copper, aluminum, a copper alloy, or the like, with higher conductivity. The common electrode lead layer 901 may be formed by chemical vapor deposition, magnetron sputtering, or the like.

Figure 8E:
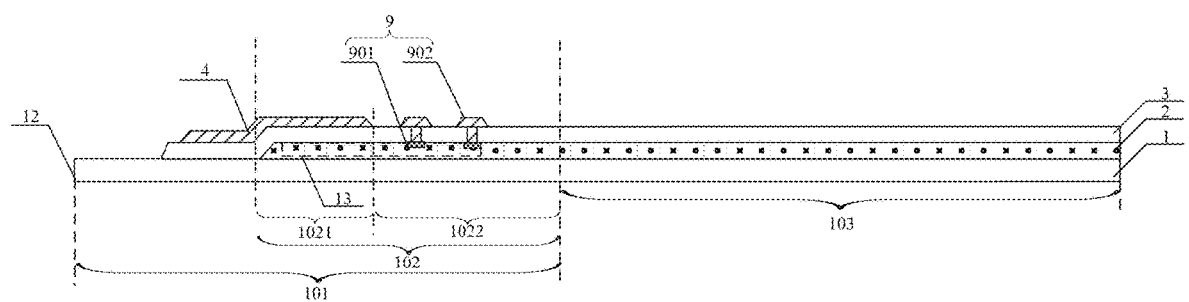

As shown in FIG. 8E, for example, the common electrode lead layer 901 may be patterned by a photolithographic process so as to form a common electrode lead 4 along at least part of the outer profile edge of the base substrate 1. The orthographic projection of the common electrode lead 4 on the base substrate 1 coincides with a portion of the projection of an internal connected portion of the peripheral circuit 13 in the peripheral circuit region 102 on the base substrate 1, that is, it overlaps with the internal connection portion of the peripheral circuit in the peripheral circuit region 102 in a direction perpendicular to the base substrate 1. In this way, the width area occupied by the common electrode lead 4 alone in the non-working region 101 can be reduced in the array substrate obtained by using the method provided by an embodiment of the present disclosure, and the array substrate can have a narrower bezel. In this way, a narrower bezel can be achieved by a display device, an illuminating device, or the like, which adopt the array substrate. The saved space may be used to increase the width of a common electrode lead, so as to reduce the resistance of the common electrode lead.

In FIG. 8E, the interlayer insulating layer 3 is arranged between the peripheral circuit 13 and the common electrode lead 4, and covers the peripheral circuit 13, so that the peripheral circuit 13 and the common electrode lead 4 are insulated from each other. The external connection portion 9 of the peripheral circuit 13 includes an external connection joint 901 and an external connection lead 902. The external connection lead 902 is formed while the common electrode lead 4 is formed by patterning the common electrode lead layer 901, namely the external connection lead 902 of the peripheral circuit 13 and the common electrode lead 4 are formed by a same patterning process with a same mask. In this way, it is beneficial to the simplification of the fabricating process of the array substrate. The external connection lead 902 is electrically connected to the external connection joint 901 through the via hole 301. In this way, the external connection joint 901 is formed in a second zone 1022 of the peripheral circuit region that does not overlap with the common electrode lead 4 in a direction perpendicular to the base substrate 1, so as to facilitate forming a via hole over the external connection joint 901 and arranging the external connection lead 902. In this way, this process will not be hindered by the common electrode lead 4.

Figure 8F:
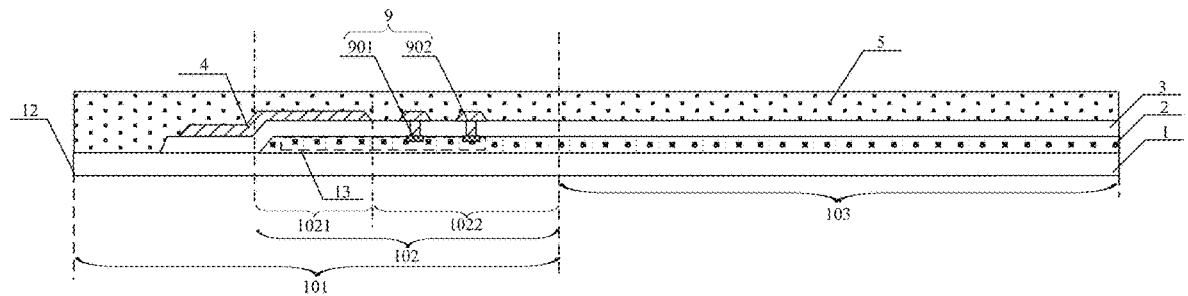

As shown in FIG. 8F, a planarization layer 5 covering the base substrate 1 is formed. The specific formation method and material of the planarization layer 5 may refer to conventional techniques in the field.

Figure 8G:
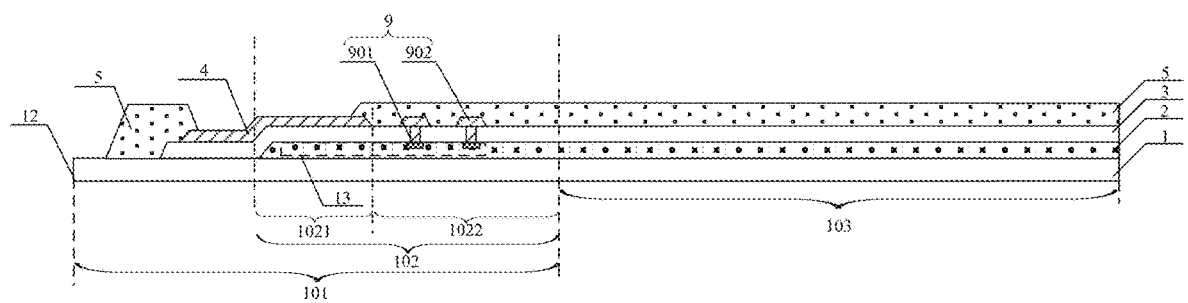

As shown in FIG. 8G, the planarization layer 5 is patterned to form an opening that exposes at least part of the common electrode lead 4.

Figure 8H:
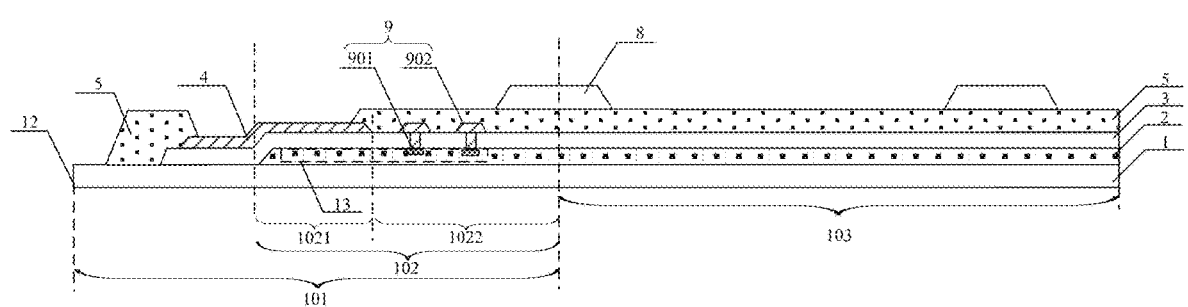

As shown in FIG. 8H, a pixel defining layer 8 is formed on the planarization layer 5 by photolithography. The pixel defining layer 8 has an opening.

Figure 8I:
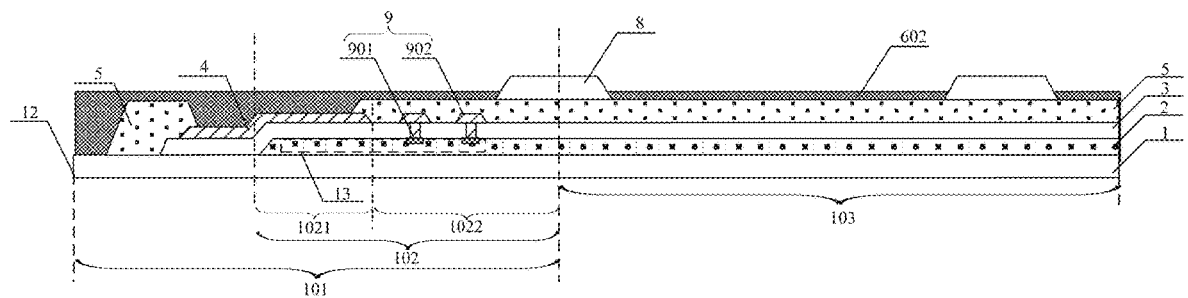

As shown in FIG. 8I, a conductive layer 602 is formed on the planarization layer 5. Material of the conductive layer 602 may be a transparent conductive material, or an opaque conductive material. The transparent conductive material may be material, such as indium tin oxide (ITO), or indium zinc oxide (IZO), or the like, and the opaque conductive material may, for example, be a metallic material, such as copper, aluminum, a copper alloy, an aluminum alloy, or the like. For example, the conductive layer 602 may be formed by chemical vapor deposition, magnetron sputtering, or the like. It is to be noted that material and specific production method of the conductive layer 602 are not limited to the above listed categories.

Figure 8J:
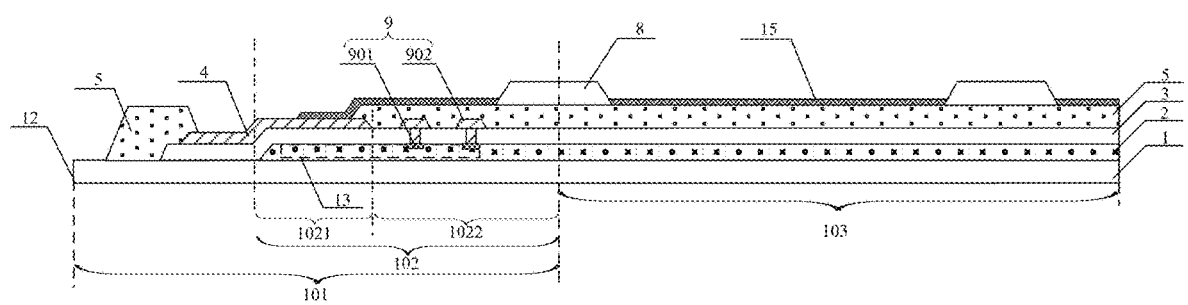

As shown in FIG. 8J, for example, the conductive layer 602 may be patterned by photolithography, to form a bridging conductive layer 6 and an anode 15 simultaneously. In other embodiment, the anode 15 formed in FIG. 8J may also be changed to be a cathode. Here, description will be made by taking the anode as an example. The anode 15 is located in the working region 103, and in an opening of the pixel defining layer 8. The bridging conductive layer 6 is formed in the peripheral circuit region 102, and is insulated from the peripheral circuit 13 and extends across the peripheral circuit 13. The bridging conductive layer 6 is electrically connected with the common electrode lead 4. In the embodiment shown in FIGS. 8A to 8M, one end of the bridging conductive layer 6 away from the working region 103 directly overlaps with the common electrode lead 4 to achieve electrical connection between the two. This direct overlapping is beneficial to the reduction of the contact resistance and is easy to be fabricated. The orthographic projection of the common electrode lead 4 on the base substrate 1 partially coincides with the orthographic projection of the peripheral circuit region 102 on the base substrate 1. For example, the orthographic projection of the common electrode lead 4 on the base substrate 1 partially coincides with the orthographic projection of the peripheral circuit 13 on the base substrate 1. That is, in a direction perpendicular to the base substrate 1, a portion of the common electrode lead 4 coincides with a portion of the peripheral circuit 12. For another example, the peripheral circuit 13 includes a plurality of circuit elements (such as thin film transistors, and leads, etc.) and a spacer zone interposed between the plurality of circuit elements, and the orthographic projection of the common electrode lead 4 on the base substrate 1 coincides with the orthographic projection of the spacer zone on the base substrate 1.

Figure 8K:
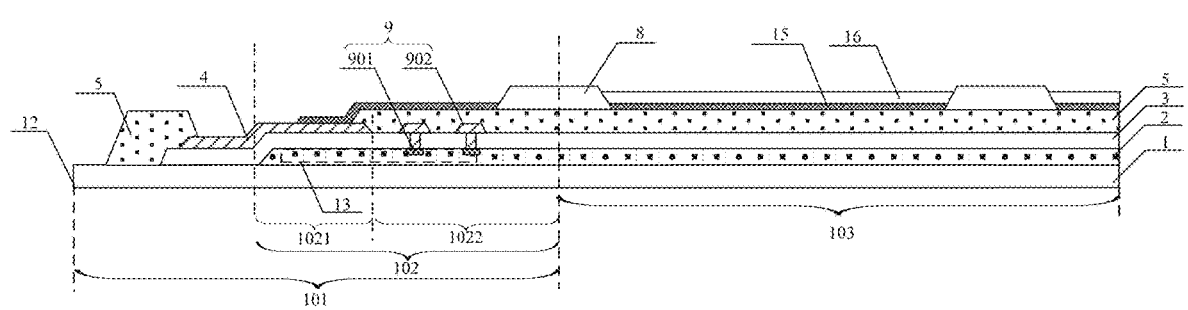

As shown in FIG. 8K, for example, an organic light-emitting layer 16 may be formed on the anode 15 by a coating process or a deposition process. In other embodiment, it may be an electroluminescent layer (e.g., an organic electroluminescent layer).

Figure 8L:
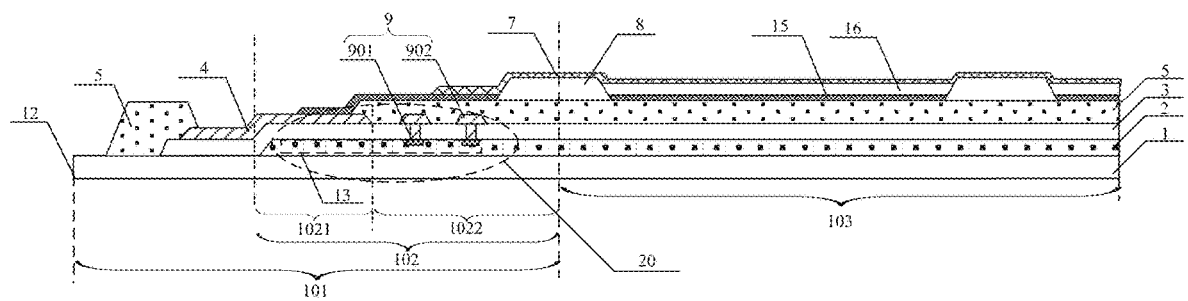

As shown in FIG. 8L, a common electrode 7 is formed in the working region 103. For example, the common electrode 7 may on the organic light-emitting layer 16 and the pixel defining layer 8, and extend to the peripheral circuit region 102 and directly contact the bridging conductive layer 6 to achieve electrical connection between them. In this way, electrical connection between the common electrode 7 and the common electrode lead 4 is achieved through the bridging conductive layer 6. That is, the bridging conductive layer 6 electrically connects the common electrode lead 4 with the common electrode 7. An array substrate 100 as shown in FIG. 8L can be formed by the above method.

Figure 8M:
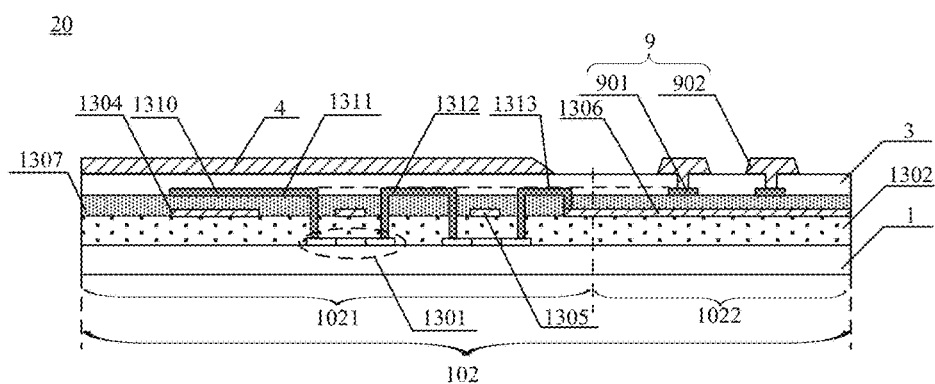
FIG. 8M is a schematically partial enlarged view of a peripheral circuit in FIG. 8L.

FIG. 8M is an enlarged schematic diagram of part 20 of the array substrate 100 in FIG. 8L. The enlarged schematic diagram exemplarily illustrates structure of the peripheral circuit 13.

Embodiments of the present disclosure provide a display-substrate peripheral circuit structure, an array substrate and a method of manufacturing the same, and a display device, in which, a common electrode lead at least partially overlaps with and is insulated from a peripheral circuit region, so that the width area occupied by the common electrode lead alone in a non-working region can be reduced, and when the peripheral circuit structure is applied to the display device and so on, it is beneficial to the realization of a narrower bezel.

The foregoing is only the exemplary embodiments of the present disclosure and not intended to limit the scope of the present disclosure. The scope of the present disclosure is defined by the appended claims.

What is claimed is:

1. A substrate, comprising
   a base substrate, comprising a working region, and a non-working region outside of the working region, the non-working region including a peripheral circuit region near the working region and a non-circuit region away from the working region;
   a peripheral circuit in the peripheral circuit region;
   a common electrode lead in the non-working region;
   a common electrode;
   a bridging conductive layer made of opaque conductive material in the non-working region and electrically connects the common electrode and the common electrode lead; and an orthographic projection of the bridging conductive layer on the base substrate at least partially coincides with an orthographic projection of the peripheral circuit region on the base substrate, and the bridging conductive layer is insulated from the peripheral circuit.

2. The substrate according to claim 1, wherein the bridging conductive layer extends across the peripheral circuit, and is made of metal material.

3. The substrate according to claim 1, wherein the opaque conductive material includes aluminum.

4. The substrate according to claim 1, wherein the bridging conductive layer is arranged on a side of the common electrode lead away from the base substrate.

5. The substrate according to claim 1, wherein the bridging conductive layer is arranged on a side of the common electrode facing the base substrate.

6. The substrate according to claim 1, wherein the peripheral circuit is not provided in the non-circuit region, an orthographic projection of the common electrode lead on the base substrate at least partially coincides with an orthographic projection of the peripheral circuit region on the base substrate, and the common electrode lead is insulated from the peripheral circuit.

7. The substrate according to claim 1, further comprising an outer profile edge, wherein the common electrode lead extends along at least part of the outer profile edge, and a portion of the common electrode lead is in the non-circuit region.

8. The substrate according to claim 7, further comprising an interlayer insulating layer, wherein the interlayer insulating layer is provided between the peripheral circuit and the common electrode lead, and covers the peripheral circuit to insulate the peripheral circuit from the common electrode lead.

9. The substrate according to claim 8, wherein an end of the interlayer insulating layer near the outer profile edge of the base substrate has a flat surface, and the common electrode lead is arranged on the flat surface; the interlayer insulating layer includes a via hole exposing an external connection joint of the peripheral circuit, and the external connection lead is electrically connected to the external connection joint of the peripheral circuit through the via hole.

10. The substrate according to claim 1, wherein the common electrode extends from the working region to the non-working region.

11. The substrate according to claim 1, wherein the bridging conductive layer is insulated from the peripheral circuit and includes two sides directly contacting the common electrode lead and the common electrode, respectively.

12. The substrate according to claim 1, wherein the peripheral circuit includes
   a first thin film transistor and a second thin film transistor, wherein each of the first thin film transistor and the second thin film transistor includes a gate electrode, a source electrode and a drain electrode;
   a capacitor including a first plate and a second plate disposed oppositely to each other, wherein the first plate and gate electrodes of the thin film transistors are arranged in the same layer;
   a peripheral circuit signal output lead configured to output an output signal of the peripheral circuit to the working region; and
   a connecting line, including a first portion;
   wherein the second plate of the capacitor is electrically connected with the source electrode of the first thin film transistor through the first portion of the connecting line; and the external connection joint, the second plate of the capacitor and the connecting line are provided in the same layer.

13. The substrate according to claim 12, wherein the connecting line further comprises a second portion and a third portion,
   wherein the drain electrode of the first thin film transistor is electrically connected with the source electrode of the second thin film transistor through the second portion of the connecting line; and the drain electrode of the second thin film transistor is electrically connected to the peripheral circuit signal output lead through the third portion of the connecting line.

14. The substrate according to claim 13, wherein the working region comprises a display element, the display element comprises:
   a pixel defining layer including a plurality of openings;
   a light-emitting layer in the plurality of openings;
   a first electrode covering the pixel defining layer and the light-emitting layer, and extending from the display region toward the common electrode lead;
   a second electrode provided between the base substrate and the light-emitting layer; and
   the first electrode is a common cathode, the common electrode lead is a common cathode wire; or the first electrode is a common anode, the common electrode lead is a common anode wire.

15. The substrate according to claim 1, wherein the peripheral circuit is a gate driving circuit of GOA type.

16. The substrate according to claim 1, wherein the peripheral circuit comprises an external connection portion, the external connection portion comprises an external connection lead; and the external connection lead and the common electrode lead are made of a same material and provided on a same layer.

17. The substrate according to claim 16, wherein the external connection portion further comprises an external connection joint;
   an orthographic projection of the external connection joint on the base substrate does not coincides with the orthographic projection of the common electrode lead on the base substrate; and
   the external connection joint is on a side of the common electrode lead near the outer profile edge of the base substrate, or the external connection joint is on a side of the common electrode lead away from the outer profile edge of the base substrate.

18. An electronic device, comprising a substrate, wherein the substrate comprises:
   a base substrate, comprising a working region, and a non-working region outside of the working region and an outer profile edge, the non-working region including a peripheral circuit region near the working region and a non-circuit region away from the working region;
   a peripheral circuit in the peripheral circuit region; and
   a common electrode lead in the non-working region;
   a common electrode;
   a bridging conductive layer made of opaque conductive material in the non-working region and electrically connects the common electrode and the common electrode lead, and
   an orthographic projection of the bridging conductive layer on the base substrate at least partially coincides with an orthographic projection of the peripheral circuit region on the base substrate, and bridging conductive layer is insulated from the peripheral circuit.

19. A method of manufacturing a substrate, comprising
   providing a base substrate, the base substrate including a working region, and a non-working region outside of the working region, the non-working region including a peripheral circuit region near the working region and a non-circuit region away from the working region;
   forming a peripheral circuit in the peripheral circuit region of the non-working region; and
   forming a common electrode lead in the non-working region;
   forming a common electrode; and
   forming a bridging conductive layer by an opaque conductive material in the non-working region to electrically connect the common electrode and the common electrode lead;
   wherein an orthographic projection of the bridging conductive layer on the base substrate at least partially coincides with an orthographic projection of the peripheral circuit region on the base substrate, and bridging conductive layer is insulated from the peripheral circuit.

20. The method according to claim 19, wherein the bridging conductive layer is formed to extend across the peripheral circuit by a metal material including aluminum, and
   the bridging conductive layer is formed in the non-working region, and is insulated from the peripheral circuit and electrically connects between the common electrode lead and the common electrode.

* * * * *